(12) United States Patent
Bollano et al.

(10) Patent No.: US 7,401,284 B2
(45) Date of Patent: Jul. 15, 2008

(54) MODULE FOR GENERATING CIRCUITS FOR DECODING CONVOLUTIONAL CODES, RELATED METHOD AND CIRCUIT

(75) Inventors: Gianmario Bollano, Turin (IT); Donato Ettorre, Turin (IT); Maura Turolla, Turin (IT)

(73) Assignee: Telecom Italia S.p.A., Milan (IT)

( * ) Notice: Subject to any disclaimer, the term of this patent is extended or adjusted under 35 U.S.C. 154(b) by 861 days.

(21) Appl. No.: 10/399,756

(22) PCT Filed: Oct. 11, 2001

(86) PCT No.: PCT/IT01/00514

§ 371 (c)(1),
(2), (4) Date: May 9, 2003

(87) PCT Pub. No.: WO02/33834

PCT Pub. Date: Apr. 25, 2002

(65) Prior Publication Data

US 2004/0013210 A1    Jan. 22, 2004

(30) Foreign Application Priority Data

Oct. 19, 2000    (IT) .............................. TO00A0984

(51) Int. Cl.
*H03M 13/03* (2006.01)
*H03M 13/00* (2006.01)

(52) U.S. Cl. .................. 714/786; 714/755; 714/781

(58) Field of Classification Search .................. 714/755, 714/786, 781, 795, 341, 262
See application file for complete search history.

(56) References Cited

U.S. PATENT DOCUMENTS 6,484,283 B2 *  11/2002  Stephen et al. .............. 714/786

OTHER PUBLICATIONS

Scalable Architectures for High Speed Channel Decoding by Dawid et al, (IEEE 1994).
Efficient Scalable Architecture for Viterbi Decoders by Bitterlich et al. (IEEE 1993).
VLSI Architectures for Turbo Codes by Masera et al. (IEEE 1999).
Implementation and Performance of a Turbo/Map Decoder by Stephen S. Pietrobon, 1998 John Wiley & Sons, Ltd., pp. 23 to 46.

* cited by examiner

*Primary Examiner*—Phung M Chung
(74) *Attorney, Agent, or Firm*—Andrew Wilford

(57) ABSTRACT

The present invention relates to a module 50 for generating integrated decoding circuits for use, in particular, in turbo devices, to the method for defining the characteristics of and generating convolutional decoding circuits, and to the circuit that can be obtained with said module 50. The module 50 is parametric and, thanks to this feature, makes it possible to generate decoding circuits having different performance characteristics which are such that they can be used in turbo devices employing different decoding modes and different architectures. In addition, the module 50 makes it possible to generate decoding circuits whose distinguishing feature is that they can manage a plurality of generator polynomials selectively and can thus also be used in asymmetrical turbo devices.

9 Claims, 5 Drawing Sheets

MODULE FOR GENERATING CIRCUITS FOR DECODING CONVOLUTIONAL CODES, RELATED METHOD AND CIRCUIT

CROSS REFERENCE TO RELATED APPLICATIONS

This application is a national stage of PCT/IT01/00514 filed 11 Oct. 2001 and based upon Italian national application TO00A000984 of 19 Oct. 2000 under the International Convention.

FIELD OF THE INVENTION

The present invention relates to a generator module for telecommunication circuits capable of decoding convolutional codes, to the method for generating this type of circuit, and to the associated circuit.

More particularly, the present invention relates to the module for generating integrated decoding circuits for use in devices for decoding concatenated convolutional codes (turbo codes), to the method for defining the characteristics of this type of circuit, and to the decoding circuit that can be obtained with this module.

BACKGROUND ART

Integrated circuits can be designed using high-level description languages such as VHDL (Very High Speed Integrated Circuit Hardware Description Language).

By means of this design technique and the use of appropriate silicon compilers, it is possible to obtain an integrated component having the characteristics specified using the high-level language, for example, the VDHL description.

It is known that the VHDL descriptions of predetermined functions such as those relating to a decoding circuit can constitute libraries of modules referred to as IP or Intellectual Property libraries whereby highly complex electronic devices such as SOC (System On Chip) systems can be constructed.

A distinguishing feature of the modules belonging to an IP library (IP modules or modules) is that they can be used in the design of multiple electronic devices, thanks to the fact that their interface parameters with other modules or electronic circuits can be "specialized" before silicon compilation, assigning specific values to variables or parameters determined at the design stage.

In accordance with the object of the present invention, reference is made to the IP module for telecommunications and the corresponding decoding circuits that can be used in devices for decoding concatenated convolutional codes (turbo decoding).

With reference to the transmission of digital information (data), it is known that the errors introduced when transmitting data on a channel make it necessary to code said data by adding redundancy bits prior to transmission, and to decode them after they are received by removing the redundancy bits. Essentially, thanks to the presence of the redundancy bits, encoding and decoding make it possible to reconstruct the initial data with a level of certainty or probability which allows for the errors introduced by the transmission channel involved.

A variety of well-known techniques can be used to encode and decode data.

For the purposes of the present invention, the convolutional encoding and decoding technique is taken into consideration, and the concatenated type, turbo encoding and decoding, in particular.

As is known, a convolutional encoding device is capable of using predetermined algorithms to take the information which precedes encoding, i.e., a priori information, into account when encoding data. As is also known, the extent to which encoding is reliable, or in other words the extent to which it guarantees that data will be correctly reconstructed, is directly proportional to the amount of a priori information that the encoding algorithm takes into account. Naturally, the complexity of the algorithm used in encoding and decoding will increase along with the amount of a priori information it considers.

To improve the results that can be attained with decoding and to reduce the complexity of the encoding and decoding circuits and devices required for any given level of performance, the so-called turbo encoding and decoding devices have been introduced.

Whether used for encoding or decoding, turbo devices comprise a plurality of convolutional circuits interconnected in concatenated fashion by means of one or more circuits (known as interleaver circuits) capable of delaying or changing the order of the bits.

In general, the architecture of turbo encoding devices (turbo encoders) thus involves using a plurality of convolutional encoding circuits interconnected using serial or parallel layouts in such a way that encoding is performed in parallel or serially.

For example, a convolutional encoding circuit (encoding circuit) 10 (FIG. 1) for turbo encoders includes a data input (u) and two outputs, one for input data (u), in which case the circuit is referred to as systematic, and one for encoding information (code) (c).

In addition, the circuit includes a shift register 12 having a length in number of bits $(v-1)$ which in the example is three bits, i.e., bit 21, bit 22 and bit 23 respectively. This shift register is capable of receiving data (u) at input and of outputting the code (c) in accordance with the type of internal connections used in encoding circuit 10.

The main parameters that characterize encoding circuit 10 are as follows:

k denotes the number of bits introduced in sequence per unit of time. In the example and in general, encoding with k=1 is used.

$k*(v-1)$ denotes the size of the shift register 12 to be used for encoding.

n denotes the number of bits output by the encoder.

In general, an encoder receives k bits at a time, which are introduced in the shift register 12 featuring $k*(v-1)$ positions; at the encoder output, there will be n output bits for every k input bits ($n \geq k$). Each output bit is calculated via a binary or modulo-2 sum of a certain number of bits in shift register 12; naturally, this sum depends on the encoder's internal connection logic and establishes the so-called generator polynomials, which will be discussed in detail later. In the example, the value u of the input bit is added to the value of a bit obtained via a feedback connection (path). The value thus obtained is then added to the value of the first bit 21 of shift register 12 and the result is added to the value of the third bit 23 of shift register 12; in the feedback path, moreover, the third bit 23 and the second bit 22 of shift register 12 are added to the input bit.

As known, encoding circuits 10 are referred to as recursive in cases where feedback connections are present.

In this way, each coded bit (c) depends not only on the k bits received at any given instant, but also on the k* bits (v−1) received previously.

In accordance with the prior art, the term "codeword" is used to designate the set of n bits supplied at the encoder output. In the example there are two codewords, viz., the data provided at input (u) and the associated code (c). The value k/n is called the "code rate".

In general, encoding circuits' performance characteristics are defined on the basis of the parameters indicated above. In particular, these characteristics include:

v Constraint length of the decoding circuit or code, which naturally depends on the length of the shift register, $N_{st}$ Number of states corresponding to the value $2^{k(v-1)}$ and which corresponds to the number of possible binary combinations in the shift register, $g_c$ Generator polynomial for c, which defines the interconnections for generating code c, and $g_f$ Generator polynomial for fm which defines the interconnections for generating feedback information f.

As is known, the generator polynomial is uniquely identified by a binary word consisting of v bits. Each bit of the binary word corresponds to a position of the input data or of the shift register and, by convention, if the bit is at value 1 in the generator polynomial, the input data or that stored in the shift register in the corresponding position participates in computing the feedback or output code. If the bit is at value 0, it does not participate.

In the example shown in FIG. 1, v is equal to 4 bits, the polynomial $g_c$ is, as will be readily apparent to specialists in the field, 1101 (13 DEC), while polynomial $g_f$ is 1011 (11 DEC).

Encoding is generally described with a so-called trellis diagram.

For the encoding circuit in FIG. 1, for example, FIG. 2 shows the corresponding trellis diagram 20 where all possible changes in the encoding circuit over time for the various input values u and circuit state are expressed graphically using connecting lines called edges. Trellis diagram 20 also shows output data. i.e., u and c respectively, on the edges.

The foregoing considerations regarding the performance characteristics of encoding circuits for turbo devices also apply to the characteristics of decoding circuits for turbo devices (turbo decoders) given that, as will be readily apparent to a specialist in the field, decoding circuits must have characteristics which are equivalent to those of encoding circuits if they are to be able to decode coded information correctly.

Naturally, input information for decoding circuits consists of bits for systematic information estimation (u) and of bits for redundancy information estimation (c) obtained in accordance with the prior art at the output of the transmission channel following a demodulation operation.

The type of encoding used by the turbo device, e.g., parallel or serial, is another of the parameters to be considered in implementing both turbo decoders and the decoding circuits they contain.

A technical disadvantage of prior art systems for designing turbo decoders is that there are no available IP modules of decoding circuits which can be used regardless of variations in characteristics.

In particular, known IP modules for generating convolutional code decoding circuits are constrained to performance characteristics, and there is thus a one-to-one correspondence between IP modules and the decoding circuits having a given set of performance characteristics.

A further disadvantage of prior art systems is that there are no available IP modules of decoding circuits that can be used regardless of variations in encoding mode.

Naturally, thus means that the IP modules of decoding circuits that can be used in turbo decoders differ according to the turbo encoding mode involved.

In addition, known IP modules of decoding circuits are constrained to the use of specific methods and technologies.

Essentially, known IP modules of decoding circuits are not parametric as regards the performance characteristics of the architecture and the decoder and, because of this limitation, make it necessary to make design choices very early in the process. If, conversely, these modules were parametric and flexible, these choices could be made at later stages. This would provide clear advantages, particularly in cases where it becomes necessary to change the characteristics of the algorithms to be used or the architecture.

Yet another technical disadvantage which specifically affects decoder circuits implemented on silicon or using programmable logic is that once implemented, these circuits can use only one generator polynomial, or in other words only one type of decoding function for reconstructing initial data.

This is an extremely significant limitation of prior art systems, particularly in the case of turbo devices which use serial decoding.

In serial mode decoding, as is known, a second decoding circuit or stage is occupied in decoding at different times than the first circuit or stage, given that information from the first stage must be used for decoding. It is thus possible in principle to use a single decoding circuit in turbo decoders which employ serial decoding approaches.

With prior art systems, however, using a single decoding circuit is possible only if the turbo decoder's decoding stages use a single pair of generator polynomials.

In cases where two or more decoding stages use different generator polynomials, this constraint means that serial turbo decoders must include a corresponding number of decoding circuits, which clearly increases the device's complexity and the associated development costs, given that each individual decoding circuit generally contains a large number of equivalent gates, e.g., around 150,000.

Naturally, this constraint would be overcome if decoder circuits for turbo devices existed which could manage a plurality of generator polynomials.

DISCLOSURE OF THE INVENTION

The object of the present invention is an IP module for generating decoding circuits featuring different performance characteristics which are such that they can be used in decoding devices employing different decoding modes and different technologies.

Another object of the present invention is a method for generating decoding modules with the characteristics indicated above.

Yet another object of the present invention is a decoding circuit for turbo devices capable of managing a plurality of generator polynomials selectively.

In accordance with these objects, the present invention proposes a generator module for decoding circuits as claimed in claim 1, a method for generating such circuits as claimed in claim 7, and a convolutional decoding circuit as claimed in claim 9.

BRIEF DESCRIPTION OF DRAWINGS

The above and other features of the present invention will be better understood from the following description of a preferred embodiment of the invention, which is intended purely by way of example and is not to be construed as limiting, where.

BEST MODE FOR CARRYING OUT THE INVENTION

Figure 3:
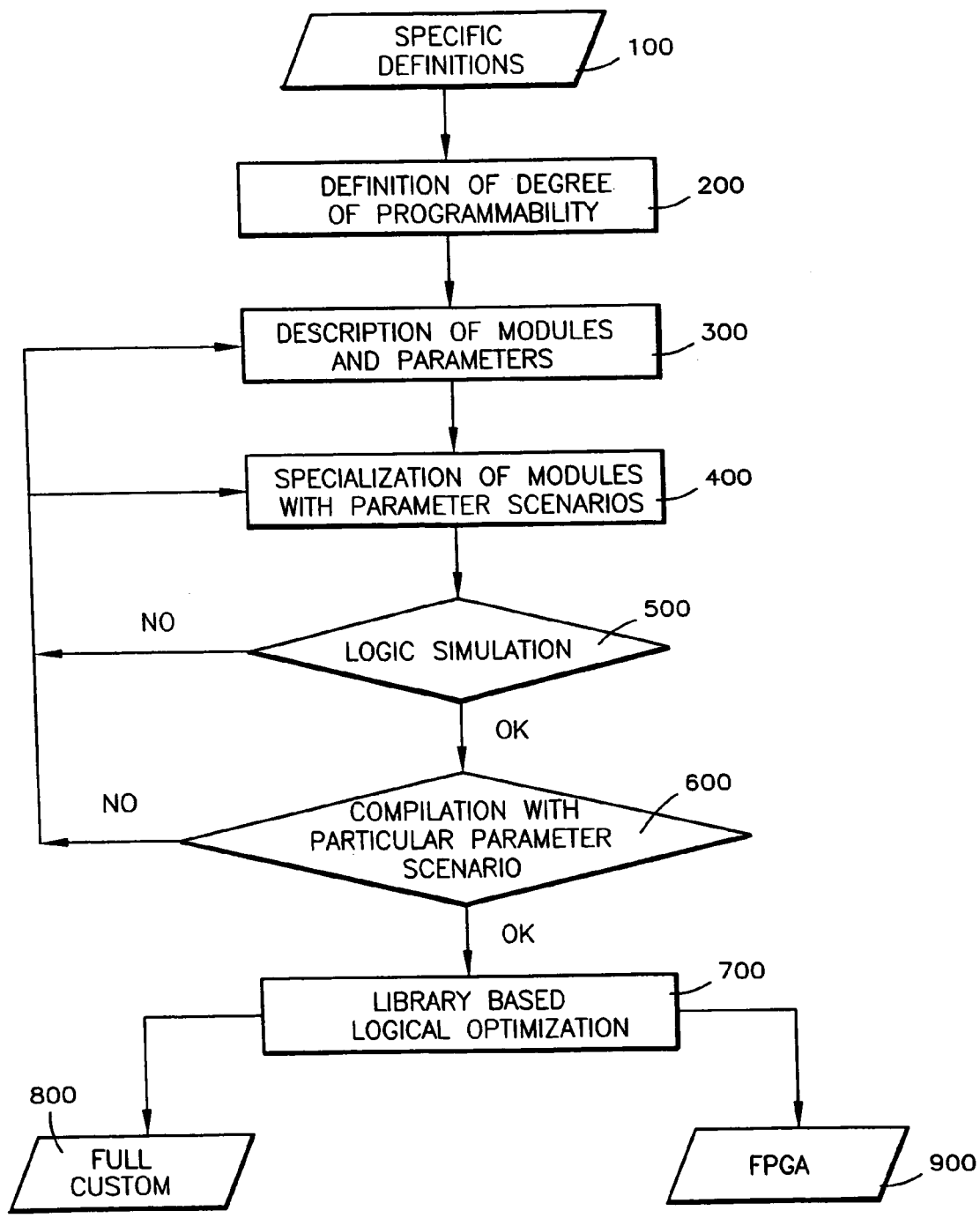
FIG. 3 represents a flow chart for generating the module and the circuit in accordance with the invention.

A preferred embodiment of the invention will be described with reference to FIG. 3, which shows the flow chart for designing a generator module for convolutional code decoding circuits in accordance with the present invention.

In a first stage designated as 100, the general specifications for the dencoding circuit are defined. In particular, various encoding methods are examined together with the possible architectures for the corresponding decoding circuits.

Taking convolutional encoding for turbo encoders as a reference, one of the first constraints for turbo decoders and the circuits they contain is that the decoding operations for convolutional codes must be iterated a number of times which is a multiple of the number of convolutional encoding circuits contained in the turbo encoder.

This means that the output of one decoder circuit will be the input of another such circuit. This in turn means that it is necessary to use Soft Input Soft Output (SISO) decoder circuits which, as is known, make it possible to continue iterating the decoding cycles until such time as the degree of reliability required by specifications has been reached. Consequently, on the basis of encoding characteristics, the first specification requirement for decoder circuit generator modules in accordance with the present invention is that these modules must generate SISO circuits in which input and output information consists of probabilistic estimates of transmitted information.

Naturally, the fact that modules for generating SISO circuits must be implemented leads to a second constraint, viz., that decoding must make use of a SISO type algorithm such as that proposed by Benedetto, Divslar, Montorsi and Pollara in the document "Soft-Input Soft-Output modules for the construction and distributed iterative decoding of code networks", Department of Electronics, Politecnico di Torino, November 1996.

$$\tilde{P}_k(c; O) = \tilde{H}_c \sum_{e:c(e)=c} A_{k-1}[s^S(e)] P_k[u(e); I] P_k[c(e); I] B_k[s^E(e)] \quad [1]$$

$$\tilde{P}_k(u; O) = \tilde{H}_u \sum_{e:u(e)=u} A_{k-1}[s^S(e)] P_k[u(e); I] P_k[c(e); I] B_k[s^E(e)] \quad [2]$$

Algorithm 1] and 2], of known type, refers to the trellis diagram edges rather than to state pairs and is thus completely general. Consequently, it can work with codes that are not necessarily binary and with trellises with multiple transitions. However, algorithm 1] and 2] has a major drawback in that it is subject to a strict implementation constraint which requires it to wait for the end of data transmission before decoding can begin.

In accordance with the objects of the present invention, it was preferred to make use of the so-called additive SISO algorithm (additive sliding window algorithm), which is likewise of known type.

This algorithm, which derives from the original SISO algorithm 1] and 2], makes it possible to work with a constant quantity of stored data (which is thus independent of transmission duration) and to return probability distributions refined with a fixed delay D, called latency, at output.

The additive version of the algorithm was chosen because it performs addition rather than multiplication operations during computation and is thus unaffected by the well-known difficulties involved in implementing multiplication operations at hardware level. The final version of the algorithm is as follows:

Given:

$$\pi_k(c; I) \overset{\Delta}{=} \log[\tilde{P}(c; I)]$$

$$\pi_k(u; I) \overset{\Delta}{=} \log[\tilde{P}(u; I)]$$

$$\pi_k(u; O) \overset{\Delta}{=} \log[\tilde{P}(c; O)]$$

$$\pi_k(u; O) \overset{\Delta}{=} \log[\tilde{P}(u; O)]$$

$$\alpha_k(s) \overset{\Delta}{=} \log[A_k(s)]$$

$$\beta_k(s) \overset{\Delta}{=} \log[B_k(s)]$$

where $\alpha$ and $\beta$, known as branch metrics, represent the weights of the previous and subsequent bits in defining the probability of a given bit at instant t.

The output probability calculation algorithm becomes:

$$\pi_{k-D}(c; O) = \log\left\{\sum_{e:c(e)=c} \exp[\alpha_{k-D-1}(s^S) + \pi_{k-D}(u; I) + \pi_{k-D}(c; I) + \beta_{k-D}(s^E)]\right\} + h_c \quad [3]$$

$$\pi_{k-D}(u; O) = \log\left\{\sum_{e:c(e)=c} \exp[\alpha_{k-D-1}(s^S) + \pi_{k-D}(u; I) + \pi_{k-D}(c; I) + \beta_{k-D}(s^E)]\right\} + h_c \quad [4]$$

where;

$$\alpha_{k-D}(s) = \log\left\{\sum_{e:s^E(e)=s} \exp[\alpha_{k-D-1}(s^S(e)) + \pi_{k-D}(u(e); I) + \pi_{k-D}(c(e); I)]\right\}$$

$$k = 1, \ldots, n$$

$$\beta_{k-1}(s) = \log\left\{\sum_{e:s^S(e)=s} \exp[\beta_k(s^S(e)) + \pi_k(u(e); I) + \pi_k(c(e); I)]\right\}$$

$$k = k, \ldots, k - D$$

where:
Letters in upper case italics (e.g., U,C,S,E) designate random variables;
Letters in lower case italics (e.g., u,c,s,e) designate individual occurrences of the random variables indicated above;
The upper case letter P(A) designates the probability of an event A;
Subscript k designates a discrete instant of time, defined in the set of time K;
A letter in lower case italics with subscript and superscript (e.g., uk1k2) designates a time sequence of the variable from instant k1 to instant k2;
The boldface lower case letters (u,c,s,e) designate the complete sequences of the associated random variables;
Round brackets "( )" designate a time sequence; and
Wavy brackets "{ }" designate a finite set of elements.
As regards the trellis diagram, on the other hand, the following notation is used:
A generic edge is represented by the variable e;
The starting state is SS(e);
The final state is SE(e);
The input symbol is u(e);
The output symbol is c(e).
Nothing changes as regards alpha probability or metric initialization; beta metrics, on the other hand, are initialized as equal and constant for all states, as iteration must start from an unknown state.

$$a = \log\left[\sum_i \exp(a_i)\right]$$

The problem of processing complexity was thus shifted from that of having to perform multiplication operations to that of computing the logarithm of an exponential sum which can be approximated by the relation:

$$a = \log\left[\sum_i \exp(a_i)\right] = \max_i a_i$$

As is known, this simplification leads to a performance degradation if there is a high signal-to-noise ratio. Consequently, if high performance is to be achieved, the following recursive algorithm can be adopted which provides the exact solution in expression 5] below:

$$a^{(1)} = a_1$$

$$a^{(l)} = \max(a^{(l-1)}, a_l) + \log[1 + \exp(-|a^{(l-1)} - a_l|)]$$

$$l = 2, \ldots, L$$

$$a \equiv a^{(L)} \quad [5]$$

where two operations are performed in order to evaluate (a) with algorithm 5]: finding the maximum of two numbers, which is relatively easy to implement, and computing $\log[1+\exp(-|\Delta|)]$.

Naturally, implementing this second operation in 5] can be accomplished by means of a look-up table.

The version of the algorithm without this feature and where the maximum value is approximated is called MAX_log_MAP, whereas the version which adopts the correction factor is called log_MAP. In all cases, both the algorithms and the implementation approximations are well known.

Thus, a second specification requirement for decoder circuit generator modules in accordance with the present invention is that a decoding algorithm for implementation in the associated circuit must be identified.

A further specification requirement to be defined at the outset in generating the module in accordance with the present invention consists of identifying one of the possible architectures for the module.

An analysis carried out at specification stage 100 indicates that the possible architectures which implement the SISO algorithm can be divided into two families: architectures with memories, and parallel register type pipeline architectures.

The former, as is known, are clearly the best choice if there are no speed constraints, as they call for far fewer resources.

If the most stringent constraints are those on speed, the only way to reach high decoding frequencies is to use parallel register type architectures employing the pipeline technique. Obviously, the choice of the architecture to be implemented will depend to a significant extent on the application for which the module is intended.

In order to take the most stringent limits into account, it was found advisable to adopt the solution with a parallel register type pipeline architecture as a third specification requirement.

In any case, as will be readily apparent from the description of the present embodiment of the invention, parts of the module for generating convolutional code decoding circuits in accordance with the present invention can also be used to implement a model capable of generating decoding circuits having an architecture with memories.

Upon completion of stage 100 in accordance with the present invention, the specifications are identified which are needed to define the types of circuit to be generated (SISO, for example), the algorithm to be implemented (e.g., the additive sliding window algorithm), and the general architecture (e.g., the parallel pipeline architecture).

In the second stage, which is designated as 200, the degree of programmability and the internal architecture of the decoding module or IP module 50 and the corresponding circuits are defined.

Figure 4:
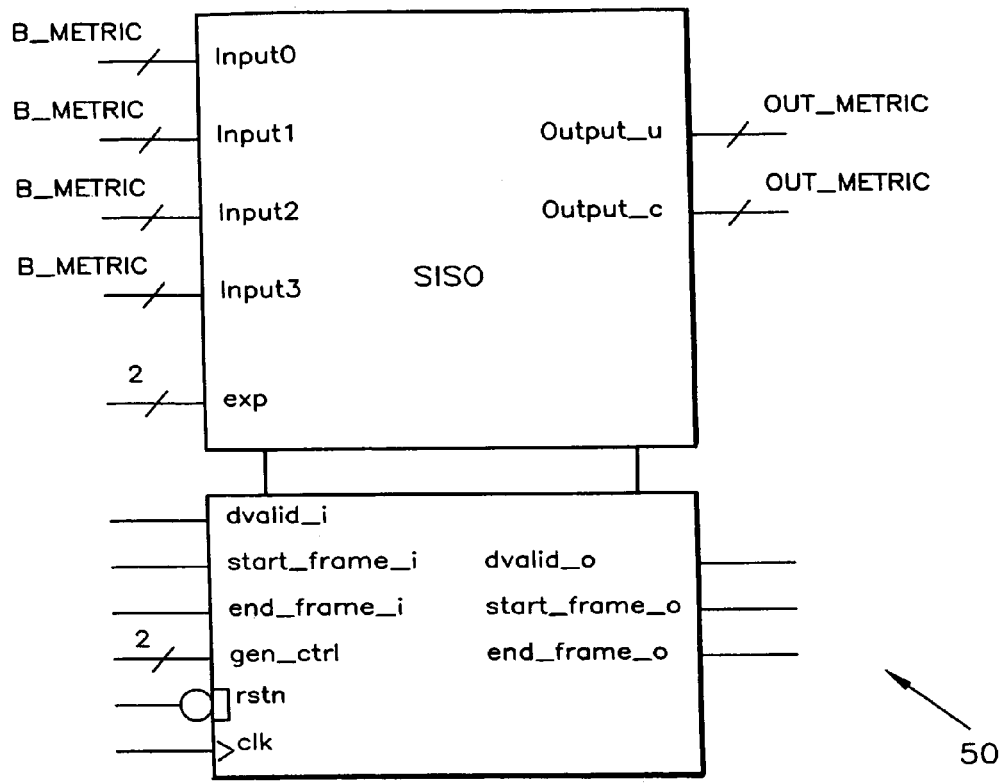
FIG. 4 represents a general input and output diagram for the module in accordance with the invention.

FIG. 4 shows the IP module 50 interface signals and their meaning, highlighting the circuit characteristics springing from their use. These characteristics are closely linked to the module's parameters, which are an effective tool for implementing circuits intended to cover a wide range of applications.

In accordance with this example of a preferred embodiment, the SISO input data (INPUT0-3) are the four word probabilities corresponding to the possible combinations of two bits, i.e., branch metrics, which constitute the signal received from the channel.

Consequently, it is assumed that there will be a module and a corresponding circuit external to the IP module 50 which is capable of determining word probabilities starting from the likelihood ratios received from the demodulator output.

Output, on the other hand, will consist of calculated probabilities together with estimates of the information bit (u) and of the redundancy bit (c).

Input/output data are implemented in the IP module 50 in parametric form, in the sense that they can be specialized prior to silicon compilation and are designed as B_METRIC and OUT_METRIC for input and output respectively.

Thanks to these parameters, it is possible to establish the number of bits used to represent input and output data magnitudes, INPUT 0-3 and Output_u, Output_c respectively.

For input data validations, the protocol features an active high signal DVALID_I.

The IP module 50 is also provided with START_FRAME_I and END_FRAME_I signals which are capable of synchronizing the module by identifying the first and last bit of the data packet. This technique guarantees module operation without having to include the length of the transmitted data packet among the parameters. Information regarding the start and end of each packet is in any case important, as the sliding window algorithm involves different initialization for metrics at the starting, operating and ending stages.

At output, there is a data validation signal (DVALID_O) and identification signals for the first and last bits in the packet (START_FRAME_O and END_FRAME_O), which the SISO module 50 needs in the subsequent iteration.

The signal designated EXP makes it possible to represent metrics with an exponential notation, where the exponent, however, is fixed for all metrics in the packet. This technique, in fact, is often used in designing turbo decoders. In effect, a critical aspect of these items is how they handle metrics which tend to increase and lead calculated magnitudes to overflow.

To prevent this, a frequently used expedient is to divide all the metrics, reducing their mantissa and retaining information for the operation that was performed through the use of a general exponent. This information is needed when the algorithm with logarithmic correction is implemented, as the correction factor is influenced by the value of the exponent. This makes it possible to avoid the problem of metric overflow without overloading the computations which would have to be carried out if each single metric were represented with an exponent.

Module 50 is also provided with a control signal GEN_CTRL which makes it possible to select among four different configurations (which can be set up among the parameters) for the code generator polynomials, and thus generate circuits capable of managing up to four different pairs of polynomials.

In particular, thanks to the GEN_CTRL control signal, it is possible to create circuits that can manage up to four pairs of different polynomials.

As the decoding circuit is highly complex, being able to use it as a shared resource is an important value-added feature.

By contrast with the prior art, where the possibility of implementing decoders for concatenated convolutional codes using a single SISO circuit is limited to the case of symmetrical transmissions, in which concatenated code units' generator polynomials do not change, the module 50 in accordance with the present invention makes it possible to generate SISO circuits that optimize resource usage and implement the two decoding stages using a single circuit which will be described in detail below.

The ability to communicate with different generator polynomials, in fact, makes it possible to overcome the limitations of prior art systems and to guarantee that even asymmetrical transmissions can be managed with a single SISO circuit.

The parametricity of module 50 springs from the efforts made to obtain circuits that are able to operate in a variety of applications.

Achieving this object involved not only defining parameters for input/output data, but also using configuration parameters internal to module 50 which, like the input/output parameters, can also be specialized at the time of silicon compilation and synthesis.

As will be described in detail below, these internal module configuration parameters are evaluated prior to synthesis and guarantee that different circuits can be generated starting from a single description.

The following description will make reference to table 1, which shows all the parameters of module 50 that can be specialized, and which include:
1-Encoding parameters
2-Decoding parameters
3-Interface parameters
4-Architecture parameters The encoding parameters characterize the transmitted code. The number of encoding states is set by the parameter N_STATES which corresponds to the value $2^{k(v-1)}$.

This parameter has enormous repercussions on the internal structure, as it plays the leading part in determining the actual resources which are used in the module.

Figure 1:
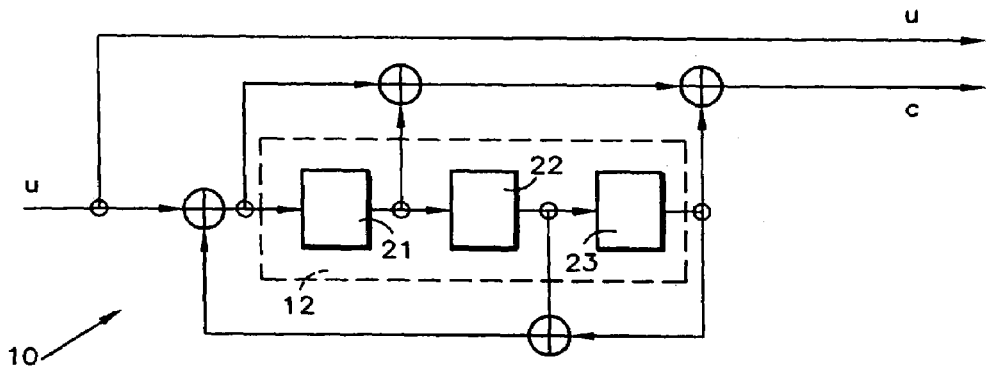
FIG. 1 represents a logic diagram of a systematic and recursive convolutional encoding circuit.
Figure 2:
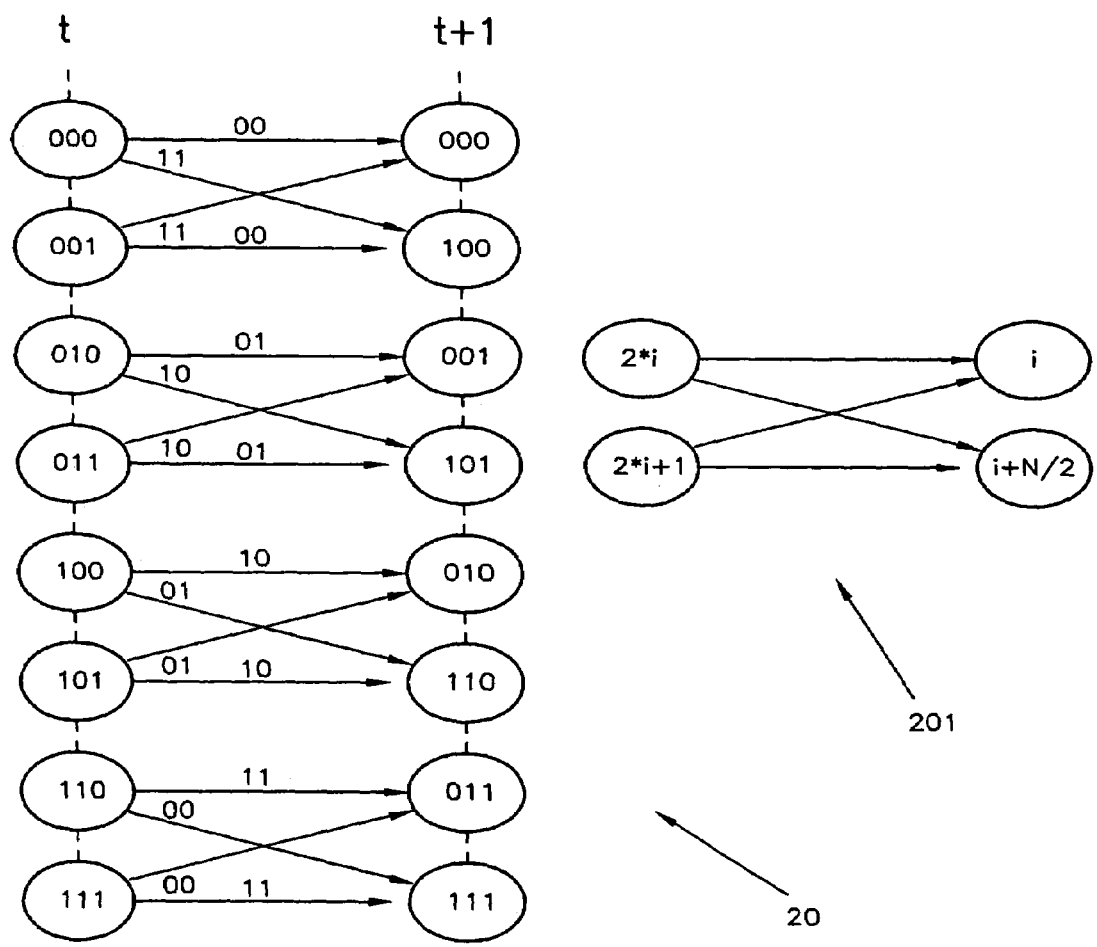
FIG. 2 represents the trellis diagram for the circuit illustrated in FIG. 1.

Once the number of states has been established and assuming k=1, the only parameters whereby trellis diagram 20 (FIG. 2), which is representative of encoding as performed, can be uniquely defined are the generator polynomials $g_c$ and $g_f$. These parameters differ from all other parameters inasmuch as they involve a stage preceding code compilation. They are, in fact, processed by a procedure which takes place before compilation and results in a package in which the trellis characterization vectors are stored. As it is possible to manage up to four pairs of different polynomials, eight different parameters will be used.

The decoding parameters characterize decoding, and as such involve only the decoder regardless of the type of encoding carried out.

The parameters designated as DEPTH and MAX_log_MAP characterize the selected algorithm, whereas OUTPUTS is influenced by the type of architecture selected for the decoder as a whole, and will now be described in detail.

- Decision DEPTH establishes the width of the windows in which iterations take place. The influence that this parameter has in the structure of the SISO circuit is chiefly apparent in the metric storage unit; as is to be expected, in fact, the number of data items to be stored increases along with the width of this window,
- MAX_log_MAP selects the implemented unit, making it possible to determine whether or not the corrective factor is neglected, and
- OUTPUTS is a parameter which optimizes circuit area occupation in accordance with specifications for the SISO module, given that certain turbo decoder configurations do not need both of the outputs generated by the SISO circuit. In such cases, it is possible to select the appropriate output and thus avoid using the logic resources that generate the magnitude which is not of interest.

The interface parameters, which have already been described in connection with the input/output signals, are involved in representing the SISO module input and output parameters.

Their presence is necessary for two reasons: the first is associated with decoding quality, as these quantities define the internal arithmetic and hence the quality of results. The second reason is connected with the need to guarantee that both the module and its interface are necessary and thus ensure that the module can be inserted in complex systems without difficulty.

In particular, the parameter B_METRIC (FIG. 4) represents the quantity of bits used in representing input probabilities, while OUT_METRIC is the cutoff effected at output.

Architecture parameters have a direct influence on internal structure for any given type of decoding, as they change its characteristics in terms of speed and area occupation. The importance this has is linked to the specific application involved.

Some systems may not pose particular requirements for data flow processing speed. In such systems, it is important to be able to reduce complexity by adopting resource sharing techniques.

The parameter designated as SPEED is thus the parameter which has the greatest impact in defining the synthesized architecture.

TABLE 1

| Parameter | Range | Description |
|---|---|---|
| Encoding parameters | | |
| N_STATES (integer) | 4-256 | Number of states in the trellis diagram |
| GEN_OUTi (i = 0, . . . , 4) (integer) | — | i-nth generator polynomial for outputs |
| GEN_FEEDBACKi (i = 0, . . . , 4) (integer) | — | i-nth generator polynomial for the feedback branch |

TABLE 1-continued

| Parameter | Range | Description |
|---|---|---|
| Decoding parameters | | |
| OUTPUTS (integer) | 0-2 | Makes it possible to select the outputs to be generated. In particular: 0 => generates u and c 1 => generates u 2 => generates c |
| DEPTH (integer) | — | Establishes window width for iterations. (Decision depth) |
| MAX_log_MAP (integer) | 0-1 | Selects operating mode: 0 => without logarithmic correction 1 => with logarithmic correction |
| Interface parameters | | |
| B_METRIC (integer) | 3-16 | Number of bits used in representing branch metrics (input probability) |
| OUT_METRIC (integer) | 3-16 | Number of bits used in representing output probabilities |
| Architecture parameters | | |
| SPEED (integer) | 0-4 | Establishes level of resource sharing. As this parameter increases, more resources are used but processing time is reduced: 1 => 1 data item every 8 clock cycles 2 => 1 data item every 4 clock cycles 3 => 1 data item every 2 clock cycles 4 => 1 data item every clock cycle |

As will be readily apparent to a specialist in the field, module 50 with the parameters thus defined makes it possible to generate convolutional decoding circuits for turbo devices with extreme flexibility. In particular, said module 50 surpasses, thanks to the parameters described above, the modules hitherto used to generate decoder circuits.

The identification of these parameters, and their implementation, is non-trivial, and is one of the qualifying features of the present invention.

The interface parameters, moreover, are an innovatory feature for the decoding circuit that can be generated by the IP module 50.

Figure 5:
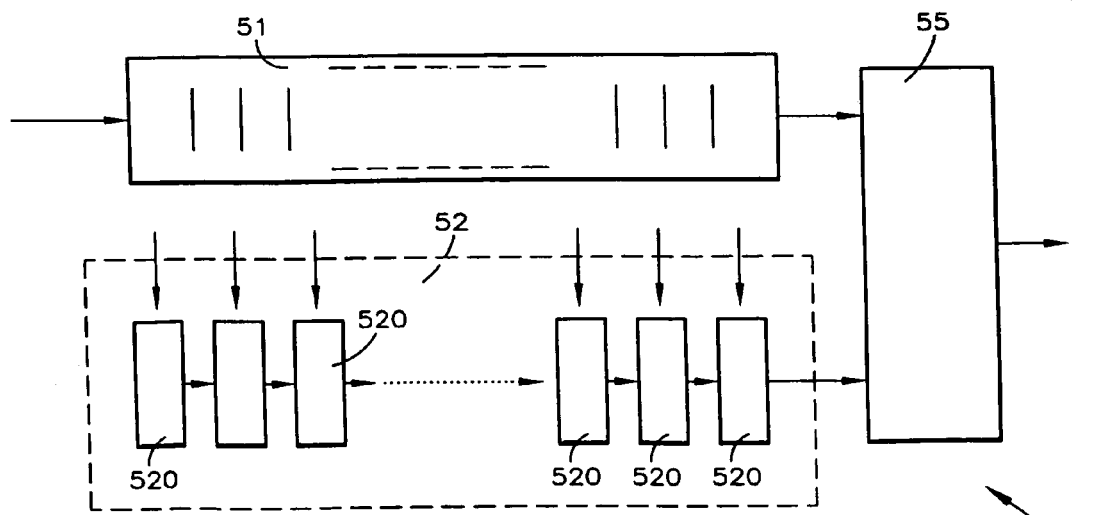
FIG. 5 represents the general architecture of the module and of the circuit that can be obtained by means of the flow chart shown in FIG. 3.

The architecture of the SISO module 50 comprises a sub-module representing a storage unit (memory module) 51 (FIG. 5) capable of storing the metrics involved in computing probabilities, a sub-module for iterations (STEP module) 52 capable of performing forward and backward iterations, and a sub-module for computing outputs (OCU module) 55 capable of computing output metrics starting from the values of the path and branch metrics.

A detailed description of each sub-module is provided below. The architecture as described is shown schematically in FIG. 5, which indicates that the part which performs iterations consists of a plurality of elementary STEP modules 520, each of which performs one step of the recursion as will be described in detail later.

In accordance with the present example of a preferred embodiment involving a parallel pipeline structure, the memory module 51 is implemented using a shift register. Register size is highly dependent on the pipe depth of the modules that compute the individual iteration steps, and is parametric on the basis of the DEPTH parameter.

Considering the registers involved in the i-nth recursion step, the depth needed for the forward iteration (alpha metrics) is equal to pipe depth minus one, as the next step needs the branch metrics for the future step. For backward iteration, on the other hand, the required depth will be that of the pipe plus one, as in this case the metrics for the previous step must be passed to the STEP modules. To optimize resource occupation, the registers for the metrics needed for forward iteration and those for backward iteration are joined in a single shift register whose amplitude is four times the value of B_METRIC.

Figure 6:
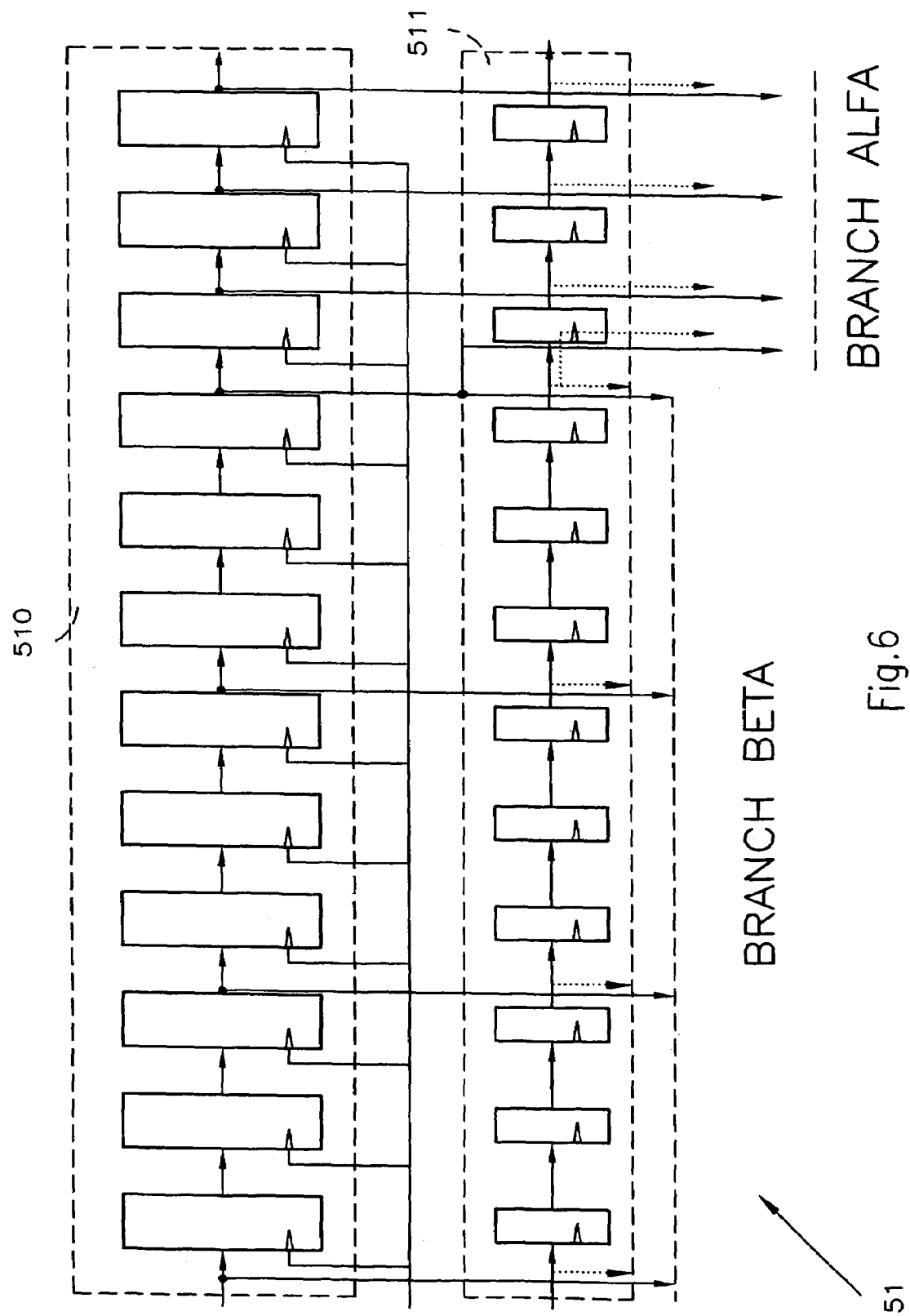
FIG. 6 represents the architecture of the memory element for the module and circuit shown in FIG. 5.

This aspect can be better understood by referring to FIG. 6, which considers a simplified example in which pipe depth is equal to two and the iteration widow is equal to four.

In this case, the depth of shift register 510 is equal to twelve, given that 2+1 shift registers are involved in each step, and four steps are needed.

At output, signals are generated that are passed to the module which computes path metrics, and are designated as ALPHA BRANCH for forward iteration and BETA BRANCH for backward iteration.

Added to shift register 510 containing branch metrics is a 1-bit shift register 511 which contains information regarding the first and last bit in the frame (stored starting from the 'start' and 'end' signals in the protocol) to permit the path metrics to be correctly initialized at the beginning and end of the frame.

Each elementary STEP module (elementary module) 520 deals with computation for one forward and backward recursion step. The part of the algorithm performed is summarized in formulas 6] and 7] given below, which are readily reached from formulas 3] and 4] by applying the development shown in formula 5].

Essentially, the path metric for each state is computed starting from the previous state for forward recursion and from the subsequent state for backward recursion.

As the metrics for the path in question are selected by the storage module (the shift register) 51, the inputs to elementary modules 520 refer to the subsequent step for beta path metrics, and to the previous step for alpha path metrics.

It should be noted the STEP module 52 and its elements 520, in accordance with the present invention, could also be fully reused in an architecture with memories, given that the task of these modules is simply to perform a step of the algorithm's forward and backward recursions, freeing it from carrying out recursion cycles.

Formulas 6] and 7]

$$\beta_k = \max_{e:s^S(e)=s} \{\beta_{k+1}[s^S(e)] + \pi_{k+1}[u(e); I] + \pi_{k+1}[c(e); I]\} + corr.$$

$$\alpha_k = \max_{e:s^E(e)=s} \{\alpha_{k-1}[s^S(e)] + \pi_k[u(e); I] + \pi_k[c(e); I]\} + corr.$$

However, given that the pipeline technique is entirely useless in solutions with memories, it would be necessary to include the number of pipe registers to be instantiated among the parameters for the solution with memories.

This, naturally, would be accomplished by making use of an optimization command typical of the synthesis program which distributes a parametric number of registers instantiated in the step tail so that the combinatory path is appropriately divided.

Consequently, the STEP module 52 and its elementary components 520 as described are independent of the architecture, whether it be a parallel pipeline architecture or an architecture with memories.

The structure of elementary STEP modules 520 will be described in detail with reference to a generic section of trellis diagram 20 (FIG. 2, FIG. 5 and FIG. 7) for encoding in a UMTS application; note that the diagram can be divided into equal butterfly type sub-parts 201) so that information regarding only two metrics is needed in order to compute two states.

On the basis of this analysis, elementary module 520 has been further divided into butterfly elementary modules 521 and split metrics elementary modules 522.

The metrics relating to butterfly 201 to be computed and the path metrics relating to the input states must be passed to butterfly modules 521.

For the i-nth butterfly 521, if the block is computing the alpha metrics (forward recursion), it is necessary to pass the metrics for states 2*i and 2*i+1, whereas if the beta metrics are being computed the metrics for states i and i+N_STATES/2 must be passed.

The task of selecting the right branch metrics at the various butterfly modules 521 has been delegated to the split metrics modules 522 which starting from the package generated automatically by the trellis and containing the trellis vectors identify the butterfly units to which they are linked and distribute the metrics for the correct words.

A battery of registers is instantiated at the output of each elementary module 520. These registers store the outputs of butterfly modules 521 in the right positions, where they can be taken by the next elementary STEP module.

Figure 7:
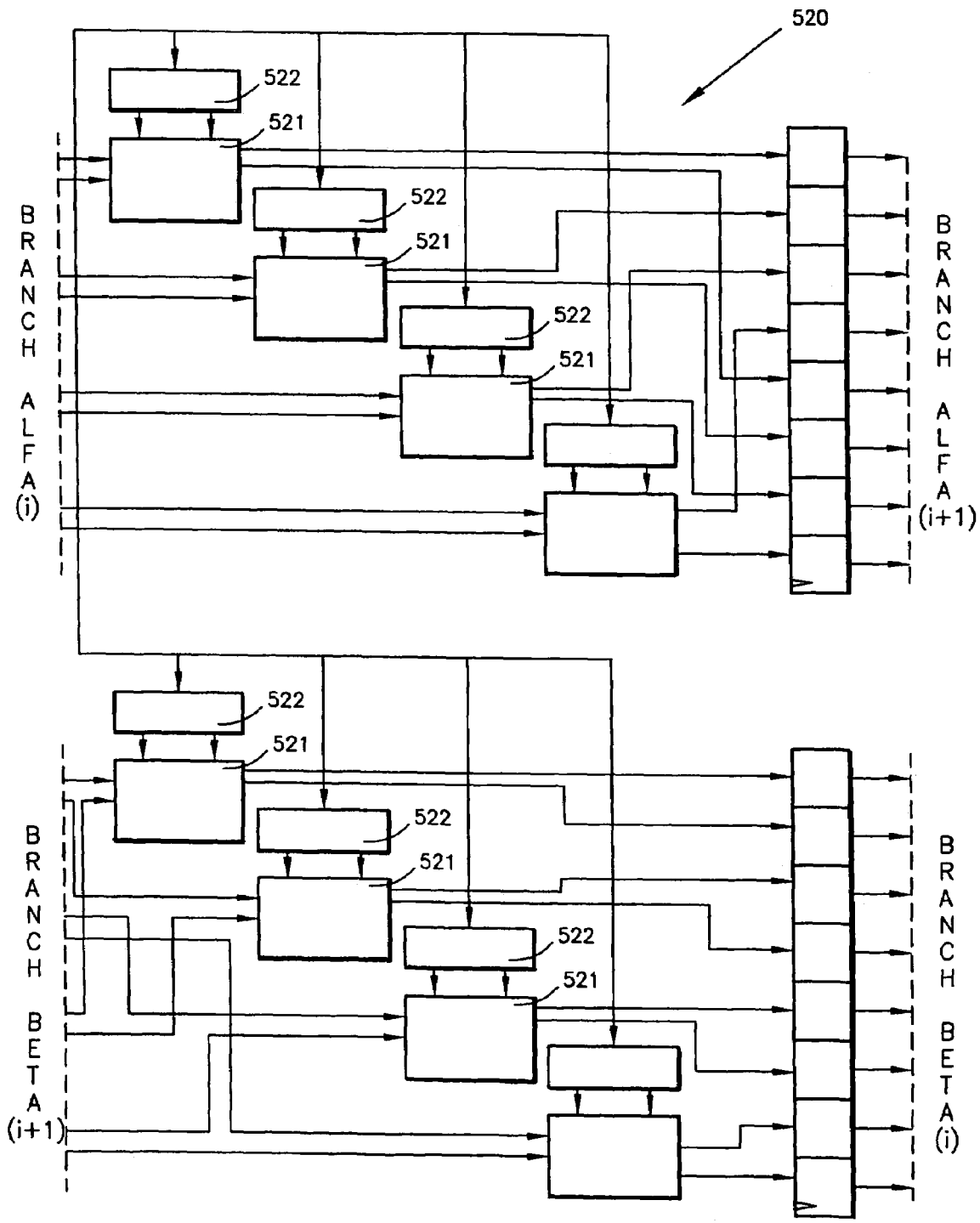
FIG. 7 represents the architecture of the characteristic computing element for the module and circuit shown in FIG. 5.

The structure obtained in accordance with this example of a preferred embodiment is illustrated in FIG. 7, which refers to the trellis diagram 20 (FIG. 2) for encoding in a UMTS application.

It should be noted that a such a breakdown of STEP module 52 (FIG. 2, FIG. 5 and FIG. 7) made it possible to achieve the parametricity shown by all features of trellis 20.

In applications where speed is not a limiting factor, it can reasonably be assumed that the butterfly modules can be shared in order to perform the functions of elementary STEP modules 520 in several clock cycles.

In particular, four configurations are envisaged for this characteristic element of the present invention; these configurations implement 8, 4, 2 and 1 butterfly modules 521 respectively. Obviously, further split metrics modules 522 for metric switching are added for these configurations, along with control modules for the various stages.

In addition, memory module 51 must guarantee that information is retained for a time exceeding one clock period. This makes it necessary to use a further control module at the next-highest hierarchical level to synchronize the STEP modules 520 and the memory module 51.

It should be noted that an approach of this kind was made possible by the special measures used in the VHDL description. By using "generate" cycles, in fact, it is possible to manage different architectural configurations with a high degree of parametricity, and at the same time to produce a description that can be synthesized and optimized.

For the sake of completeness, it should be emphasized that the function of butterfly modules 521 is to compute the path metrics given the metrics at the previous step and the branch metrics. In the schematic representation of butterfly modules 521, clock, reset and protocol signals are neglected.

The operations to be carried out are characterized by expressions 8] and 9] as given below $$OUT\_UP = \max[IN\_UP + PRB\_A, IN\_DN + PRB\_B] + corr$$

$$OUT\_DN = \max[IN\_UP + PRB\_B, IN\_UP + PRB\_A] + corr$$

where OUT_UP and OUT_DN represent the output path metrics calculated starting from IN_UP-IN_DN (input path metrics) and PRB_A-PRB_B (input branch metrics), and which represent a correction factor.

This correction factor is computed by a separate module which simply implements a look-up table. This solution was adopted in order to delegate algorithm selection to the user by means of the Max_log_MAP parameter. This module instantiates to further sub-modules which carry out the elementary function of performing two addition operations, comparing them, and selecting the largest sum.

These ACS (Add Compare Select) modules, which are not shown in the figure, are the basic computation blocks for decoder module 50, and are the computation units distributed in the entire SISO.

The Split_metrics modules 522 were developed specifically to permit parametric description of STEP module 52.

In fact, the greatest difficulty in managing different parametric state generator polynomials lies in selecting the right branch metrics.

The Split_metrics module 522 starts from a parameter passed in the description and, during synthesis, generates programmable multiplexers on the basis of the vector values generated by the trellis parameters. These vectors are packaged at the time of generation.

Developing this module made it possible to provide an important value-added feature, as multiple pairs of parameters can be passed as parameters. The gen_ctrl signal which manages the generator polynomials to be used acts directly on the split_metric modules, which generates a circuit logic made up chiefly of multiplexers whereby the interconnections are switched as needed. It was found that if all of the vector pairs are the same, the synthesis program does not instantiate supplementary logic of any kind, as it proceeds to set up the interconnections.

The OCU module 55 in this example of a preferred embodiment is the module which computes outputs on the basis of the iteration results supplied by the elementary STEP modules 520 and the input data.

This module performs the functions as per formulas 10] and 11] given below:

Formulas 10] and 11]

$$\pi_k(c; O) = \max_{e:c(e)=c} \lfloor \alpha_{k-1}(s^S) + \pi_k(u; I)\pi_k(c; I) + \beta_{k-1}(s^S) \rfloor$$

$$\pi_k(u; O) = \max_{e:u(e)=u} [\alpha_{k-1}(s^S) + \pi_k(u; I)\pi_k(c; I) + \beta_{k-1}(s^S)]$$

As can readily be seen, these formulas differ only slightly from formulas 6] and 7]. Consequently, the OCU module 55 is characterized by the fact that its architecture is similar in all respects to that of the elementary STEP modules 520.

Once stage 200 has been completed and the degree of programmability and the internal architecture of the IP module 50 have been defined, a third stage 300 is carried out. In this third stage, which is another characteristic feature of the present invention, the individual sub-modules constituting the IP module 50 are developed and described, e.g., using the VHDL language.

For the sake of completeness, the sources of the significant modules used in implementing the present invention are given below.

In particular, the so-called "entities" and "structural descriptions" (terms whose meaning will be known to those familiar with the formalisms used in describing modules in VHDL language) for the significant modules are provided.

---

VHDL CODE FOR SISO MODULE 50

```
VHDL Code (entities and structural descriptions)
entity SISO is
    generic (
        OUTPUTS         : integer := 0;
        DEPTH           : integer := 20;        -- Recursion Window
        SPEED           : integer := 4;         -- Speed configuration
        REG_DIM         : integer := 3;         -- 3 if SPEED = 4 else 2
        MAX_log_MAP     : integer := 0;         -- 0 -> no log correction, 1 -> log correction
        B_METRIC        : integer := 5;         -- Branch prob. metric
        OUT_METRIC      : integer := 5;
        N_STATES        : integer := 8          -- Number of states
    );
    port (
        CLK             : in std_ulogic; -- Clock
        RSTN            : in std_ulogic; -- Reset, active low
        DVALID_I        : in std_ulogic;
        START_FRAME_I   : in std_ulogic;
        END_FRAME_I     : in std_ulogic;
        GEN_CTRL        : in std_ulogic_vector(1 downto 0);   -- 00 -> gen 1,
                                                              -- 01 -> gen 2,
                                                              -- 10 -> gen 3,
                                                              -- 11 -> gen 4;
        EXP             : in std_ulogic_vector(1 downto 0);
        INPUT_0         : in std_ulogic_vector(B_METRIC-1 downto 0);
        INPUT_1         : in std_ulogic_vector(B_METRIC-1 downto 0);
        INPUT_2         : in std_ulogic_vector(B_METRIC-1 downto 0);
        INPUT_3         : in std_ulogic_vector(B_METRIC-1 downto 0);
        DVALID_O        : out std_ulogic;
        START_FRAME_O   : out std_ulogic;
```

```vhdl
        END_FRAME_O        :       out std_ulogic;
        OUTPUT_U           :       out std_ulogic_vector(OUT_METRIC-1 downto 0);
        OUTPUT_C           :       out std_ulogic_vector(OUT_METRIC-1 downto 0)
   );
   begin
end SISO ;
architecture STRS of SISO is
    type my_vect is array (0 to DEPTH) of std_ulogic_vector(N_STATES* (B_METRICS+LOG2C(DEPTH+1))-1 downto 0);
    signal ALFA : my_vect;
    signal BETA : my_vect;
    signal ALFA_IN : my_vect;
    signal BETA_IN : my_vect;
    signal ALFA_OCU : std_ulogic_vector(N_STATES* (B_METRIC+LOG2C(DEPTH+1))-1 downto 0);
    signal BETA_OCU : std_ulogic_vector(N_STATES* (B_METRIC+LOG2C(DEPTH+1))-1 downto 0);
    signal OUTPUT_0 : std_ulogic_vector(B_METRIC-1 downto 0);
    signal OUTPUT_1 : std_ulogic_vector(B_METRIC-1 downto 0);
    signal OUTPUT_2 : std_ulogic_vector(B_METRIC-1 downto 0);
    signal OUTPUT_3 : std_ulogic_vector(B_METRIC-1 downto 0);
    signal OUTPUT_0_REG : std_ulogic_vector(B_METRIC-1 downto 0);
    signal OUTPUT_1_REG : std_ulogic_vector(B_METRIC-1 downto 0);
    signal OUTPUT_2_REG : std_ulogic_vector(B_METRIC-1 downto 0);
    signal OUTPUT_3_REG : std_ulogic_vector(B_METRIC-1 downto 0);
    signal INPUT_0_REG : std_ulogic_vector(B_METRIC-1 downto 0);
    signal INPUT_1_REG : std_ulogic_vector(B_METRIC-1 downto 0);
    signal INPUT_2_REG : std_ulogic_vector(B_METRIC-1 downto 0);
    signal INPUT_3_REG : std_ulogic_vector(B_METRIC-1 downto 0);
    signal BRANCH_ALFA_0 : std_ulogic_vector(B_METRIC*DEPTH-1 downto 0);
    signal BRANCH_ALFA_1 : std_ulogic_vector(B_METRIC*DEPTH-1 downto 0);
    signal BRANCH_ALFA_2 : std_ulogic_vector(B_METRIC*DEPTH-1 downto 0);
    signal BRANCH_ALFA_3 : std_ulogic_vector(B_METRIC*DEPTH-1 downto 0);
    signal BRANCH_BETA_0 : std_ulogic_vector(B_METRIC*DEPTH-1 downto 0);
    signal BRANCH_BETA_1 : std_ulogic_vector(B_METRIC*DEPTH-1 downto 0);
    signal BRANCH_BETA_2 : std_ulogic_vector(B_METRIC*DEPTH-1 downto 0);
    signal BRANCH_BETA_3 : std_ulogic_vector(B_METRIC*DEPTH-1 downto 0);
    signal S_REG_ENABLE : std_ulogic;
    signal STEP_ENABLE : std_ulogic;
    signal OUT_ENABLE : std_ulogic;
    signal OUTPUT_ENABLE : std_ulogic;
    signal ENABLE_INT : std_ulogic;
    signal ENABLE_INT1 : std_ulogic;
    signal CONTROL_ENABLE : std_ulogic;
    signal ENABLE std_ulogic_vector(1 downto 0);
    signal INPUT_ENABLE : std_ulogic;
    signal INPUT_ENABLE_INT : std_ulogic;
    signal SEL_A : std_ulogic;
    signal SEL_B : std_ulogic;
    signal SIG1 : std_ulogic;
    signal SIG2 : std_ulogic;
    signal SIG3 : std_ulogic;
    signal SIG4 : std_ulogic;
    signal START_END : std_ulogic;
    signal S_REG_START_IN : std_ulogic;
    signal START_FRAME_REG: std_ulogic;
    signal END_FRAME_REG : std_ulogic;
    signal DVALID_I_REG: std_ulogic;
    signal START_END_SIG : std_ulogic;
    signal START_OUT_REGISTERS : std_ulogic_vector(5 downto 0);
    signal END_OUT_REGISTERS : std_ulogic_vector(5 downto 0);
    signal START_REG_ALFA : std_ulogic_vector(DEPTH-1 downto 0);
    signal START_REG_BETA : std_ulogic_vector(DEPTH-1 downto 0);
    signal START_ALFA : std_ulogic_vector(DEPTH-1 downto 0);
    signal START_BETA : stu_ulogic_vector(DEPTH-1 downto 0);
--      signal STEP_SYNCH_IN : std_ulogic;
    signal DVALID_INT : std_ulogic;
    signal SEL : std_ulogic;
    -- signals for 1 bit registers
    signal START_FRAME_I_ARRAY       : std_ulogic_vector(0 downto 0);
    signal START_FRAME_REG_ARRAY     : std_ulogic_vector(0 downto 0);
    signal END_FRAME_I_ARRAY         : std_ulogic_vector(0 downto 0);
    signal END_FRAME_REG_ARRAY       : std_ulogic_vector(0 downto 0);
    signal DVALID_I_ARRAY            : std_ulogic_vector(0 downto 0);
    signal DVALID_I_REG_ARRAY        : std_ulogic_vector(0 downto 0);
    signal START_END_SIG_ARRAY       : std_ulogic_vector(0 downto 0);
    signal DVALID_INT_ARRAY   : std_ulogic_vector(0 downto 0);
    constant CONST_0 : std_ulogic_vector(N_STATES* (B_METRIC+LOG2C(DEPTH+1))-1 downto 0) :=
    std_ulogic_vector(conv_std_logic_vector((2**B_METRIC)-1,N_STATES*(B_METRIC+LOG2C(DEPTH+1))));
begin
```

```
ALFA(DEPTH) <= (others => '0');
BETA(DEPTH) <= (others => '0');
-------------------------------------------------------------------------
-- INPUT REGISTRATIONS
I_INPUT_0_REGISTER : REGISTERS
    generic map (
        REG_DIM     =>      B_METRIC)
    port map (
        CLK         =>      CLK,
        RSTN        =>      RSTN,
        SEL         =>      INPUT_ENABLE,
        INPUT       =>      INPUT_0,
        OUTPUT      =>      INPUT_0_REG);
I_INPUT_1_REGISTER : REGISTERS
    generic map (
        REG_DIM     =>      B_METRIC)
    port map (
        CLK         =>      CLK,
        RSTN        =>      RSTN,
        SEL         =>      INPUT_ENABLE,
        INPUT       =>      INPUT_1,
        OUTPUT      =>      INPUT_REG);
I_INPUT_2_REGISTER : REGISTERS
    generic map (
        REG_DIM     =>      B_METRIC)
    port map (
        CLK         =>      CLK,
        RSTN        =>      RSTN,
        SEL         =>      INPUT_ENABLE,
        INPUT       =>      INPUT_2,
        OUTPUT      =>      INPUT_2_REG);
I_INPUT_3_REGISTER : REGISTERS
    generic map (
        REG_DIM     =>      B_METRIC)
    port map (
        CLK         =>      CLK,
        RSTN        =>      RSTN,
        SEL         =>      INPUT_ENABLE,
        INPUT       =>      INPUT_3,
        OUTPUT      =>      INPUT_3_REG);
START_FRAME_I_ARRAY (0) <= START_FRAME_I;
I_START_FRAME_REGISTER : REGISTERS
    generic map (
        REG_DIM     =>      1)
    port map (
        CLK         =>      CLK,
        RSTN        =>      RSTN,
        SEL         =>      INPUT_ENABLE,
        INPUT       =>      START_FRAME_I_ARRAY,
        OUTPUT      =>      START_FRAME_REG_ARRAY);
START_FRAME_REG <= START_FRAME_REG_ARRAY (0);
END_FRAME_I_ARRAY (0) <= END_FRAME_I;
I_END_FRAME_REGISTER : REGISTERS
    generic map (
        REG_DIM     =>      1)
    port map (
        CLK         =>      CLK,
        RSTN        =>      RSTN,
        SEL         =>      INPUT_ENABLE,
        INPUT       =>      END_FRAME_I_ARRAY,
        OUTPUT      =>      END_FRAME_REG_ARRAY);
END_FRAME_REG <= END_FRAME_REG_ARRAY (0);
DVALID_I_ARRAY (0) <= DVALID_I;
I_DVALID_I_REGISTER : REGISTERS
    generic map (
        REG_DIM     =>      1)
    port map (
        CLK         =>      CLK,
        RSTN        =>      RSTN,
        SEL         =>      INPUT_ENABLE,
        INPUT       =>      DVALID_I_ARRAY,
        OUTPUT      =>      DVALID_I_REG_ARRAY);
DVALID_I_REG <= DVALID_I_REG_ARRAY (0);
-------------------------------------------------------------------------
-- SHIFT REGISTER
S_REG_START_IN <= START_FRAME_REG or END_FRAME_REG;
I_S_REG : S_REG
    generic map (
        DEPTH       =>      DEPTH,
```

```
                SPEED           =>      SPEED,
                REG_DIM         =>      REG_DIM
                B_METRIC        =>      B_METRIC)
            port map (
                CLK             =>      CLK,
                RSTN            =>      RSTN,
                ENABLE          =>      S_REG_ENABLE,
                START_IN        =>      S_REG_START_IN,
                INPUT_0         =>      INPUT_0_REG,
                INPUT_1         =>      INPUT_1_REG,
                INPUT_2         =>      INPUT_2_REG,
                INPUT_3         =>      INPUT_3_REG,
                BRANCH_ALFA_0   =>      BRANCH_ALFA_0,
                BRANCH_ALFA_1   =>      BRANCH_ALFA_1,
                BRANCH_ALFA_2   =>      BRANCH_ALFA_2,
                BRANCH_ALFA_3   =>      BRANCH_ALFA_3,
                BRANCH_BETA_0   =>      BRANCH_BETA_0,
                BRANCH_BETA_1   =>      BRANCH_BETA_1,
                BRANCH_BETA_2   =>      BRANCH_BETA_2,
                BRANCH_BETA_3   =>      BRANCH_BETA_3,
                START_REG_ALFA  =>      START_REG_ALFA,
                START_REG_BETA  =>      START_REG_BETA,
                OUTPUT_0        =>      OUTPUT_0,
                OUTPUT_1        =>      OUTPUT_1,
                OUTPUT_2        =>      OUTPUT_2,
                OUTPUT_3        =>      OUTPUT_3);
    I_OUTPUT_0_REGISTER : REGISTERS
            generic map (
                REG_DIM =>      B_METRIC)
            port map (
                CLK             =>      CLK,
                RSTN            =>      RSTN,
                SEL             =>      OUTPUT_ENABLE,
                INPUT           =>      OUTPUT_0,
                OUTPUT          =>      OUTPUT_0_REG);
    I_OUTPUT_1_REGISTER : REGISTERS
            generic map (
                REG_DIM         =>      B_METRIC)
            port map (
                CLK             =>      CLK,
                RSTN            =>      RSTN,
                SEL             =>      OUTPUT_ENABLE,
                INPUT           =>      OUTPUT_1,
                OUTPUT          =>      OUTPUT_1_REG);
    I_OUTPUT_2_REGISTER : REGISTERS
            generic map (
                REG_DIM         =>      B_METRIC)
            port map (
                CLK             =>      CLK,
                RSTN            =>      RSTN,
                SEL             =>      OUTPUT_ENABLE,
                INPUT           =>      OUTPUT_2
                OUTPUT          =>      OUTPUT_2_REG);
    I_OUTPUT_3_REGISTER : REGISTERS
            generic map (
                REG_DIM         =>      B_METRIC)
            port map (
                CLK             =>      CLK,
                RSTN            =>      RSTN,
                SEL             =>      OUTPUT_ENABLE,
                INPUT           =>      OUTPUT_3,
                OUTPUT          =>      OUTPUT_3_REG);
---------------------------------------------------------------------------
-- STEPS
STEP_INST: for i in DEPTH-1 downto 0 generate
        -- Multiplexer at the input of each Step
        ALPA_IN(i) <= ALPA(i+1) when START_ALFA(i) = '0' else CONST_0;
        BETA_IN(i) <= BETA(i+1) when START_BETA(i) = '0' else CONST_0;
        -- Multiplexer for control signals
        START_ALFA(i) <= START_REG_ALFA(i) when SEL_A = '1' else '0';
        START_BETA(i) <= START_REG_BETA(i) when SEL_B = '1' else '0';
        I_STEP : STEP
            generic map (
                SPEED           =>      SPEED,
                MAX_log_MAP     =>      MAX_log_MAP,
                B_METRIC        =>      B_METRIC,
                S_METRIC_MAX    =>      B_METRIC+LOG2C(DEPTH+1),
                S_METRIC_IN     =>      B_METRIC+LOG2C(DEPTH-i),
                S_METRIC_OUT    =>      B_METRIC+LOG2C(DEPTH-i+1),
```

```
                    N_STATES          =>      N_STATES)
            port map (
                CLK                   =>      CLK,
                RSTN                  =>      RSTN,
                SYNCH_IN              =>      SIG1, -- STEP_SYNCH_IN,
                ENABLE                =>      STEP_ENABLE
                GEN_CTRL              =>      GEN_CTRL,
                EXP                   =>      EXP,
                BRANCH_ALPA_0         =>      BRANCH_ALFA_0 (B_METRIC* (i+1)-1 downto B_METRIC*i),
                BRANCH_ALFA_1         =>      BRANCH_ALFA_1 (B_METRIC* (i+1)-1 downto B_METRIC*i),
                BRANCH_ALFA_2         =>      BRANCH_ALFA_2 (B_METRIC* (i+1)-1 downto B_METRIC*i),
                BRANCH_ALFA_3         =>      BRANCH_ALFA_3 (B_METRIC* (i+1)-1 downto B_METRIC*i),
                BRANCH_BETA_0         =>      BRANCH_BETA_0 (B_METRIC* (i+1)-1 downto B_METRIC*i),
                BRANCH_BETA_1         =>      BRANCH_BETA_1 (B_METRIC* (i+1)-1 downto B_METRIC*i),
                BRANCH_BETA_2         =>      BRANCH_BETA_2 (B_METRIC* (i+1)-1 downto B_METRIC*i),
                BRANCH_BETA_3         =>      BRANCH_BETA_3 (B_METRIC* (i+1)-1 downto B_METRIC*i),
                ALFA_IN               => ALFA_IN(i),    -- (N_STATES* (B_METRIC+LOG2C(DEPTH-i))-1 downto 0),
                BETA_IN               => BETA_IN(i),    -- (N_STATES* (B_METRIC+LOG2C(DEPTH-i))-1 downto 0),
                ALFA_OUT              => ALFA(i),       -- (N_STATES* (B_METRIC+LOG2C(DEPTH-i+1))-1 downto 0),
                BETA_OUT              => BETA(i));      -- (N_STATES* (B_METRIC+LOG2C(DEPTH-i+1))-1 downto 0));
            -- ALFA and BETA (0) are the output of step tail
            -- ALFA and BETA (DEPTH) are the input of step tail
    end generate STEP_INST;
    ------------------------------------------------------------------------
    -- OCU
    ALFA_OCU <= CONST_0 when (START_END_SIG and SEL_A)='1' else ALFA(0);
    BETA_OCU <= CONST_0 when (START_END_SIG and SEL_B)='1' else BETA(0);
    I_OCU : OCU
        generic map (
            OUTPUTS                   =>      OUTPUTS,
            N_STATES                  =>      N_STATES,
            SPEED                     =>      4,
            OUT_METRIC                =>      OUT_METRIC,
            B_METRIC                  =>      B_METRIC,
            S_METRIC                  =>      B_METRIC+LOG2C(DEPTH+1))
        port map (
            CLK                       =>      CLK,
            RSTN                      =>      RSTN,
            ENABLE                    =>      OUT_ENABLE,
            GEN_CTRL                  =>      GEN_CTRL,
            INPUT_0                   =>      OUTPUT_0_REG,
            INPUT_1                   =>      OUTPUT_1_REG,
            INPUT_2                   =>      OUTPUT_2_REG,
            INPUT_3                   =>      OUTPUT_3_REG,
            INPUT_ALFA                =>      ALFA_OCU,
            INPUT_BETA                =>      BETA_OCU,
            OUTPUT_U                  =>      OUTPUT_U,
            OUTPUT_C                  =>      OUTPUT_C);
    ------------------------------------------------------------------------
    -- STATUS SIGNALS
    SIG1 <= START_FRAME_REG and DVALID_I_REG;
    SIG2 <= START_REG_ALFA(0);
    SIG3 <= END_FRAME_REG and DVALID_I_REG;
    SIG4 <= END_OUT_REGISTERS(0); --START_REG_BETA(0);
    ------------------------------------------------------------------------
    -- CONTROL SIGNALS
    -- SPEED 4
    ENABLE_INT <= ENABLE (1) or (ENABLE (0) and DVALID_I_REG);
    S_REG_ENABLE      <=      INPUT_ENABLE and ENABLE_INT;
    OUTPUT_ENABLE     <=      ENABLE_INT1;
    OUT_ENABLE        <=      ENABLE_INT1;
    STEP_ENABLE       <=      ENABLE_INT;
    ------------------------------------------------------------------------
    -- CONTROL SPEED
    I_CONTROL_SPEED : CONTROL_SPEED
        generic map (
            SPEED                     =>      SPEED)
        port map (
            CLK                       =>      CLK,
            RSTN                      =>      RSTN,
            ENABLE_INT                =>      ENABLE_INT,
            INPUT_ENABLE              =>      INPUT_ENABLE_INT,
            CONTROL_ENABLE            =>      CONTROL_ENABLE,
            ENABLE_INT_O              =>      ENABLE_INT1,
            INPUT_ENABLE_O            =>      INPUT_ENABLE);
--          STEP_SYNCH                =>      STEP_SYNCN_IN);
    ------------------------------------------------------------------------
    -- CONTROL UNIT
    I_CONTROL_UNIT : CONTROL_UNIT
```

```
        generic map (
            SPEED => SPEED)
        port map (
            CLK                 =>      CLK,
            RSTN                =>      RSTN,
            CONTROL_ENABLE      =>      CONTROL_ENABLE,
            SIG1                =>      SIG1,
            SIG2                =>      SIG2,
            SIG3                =>      SIG3,
            SIG4                =>      SIG4,
            INPUT_ENABLE        =>      INPUT_ENABLE_INT,
            ENABLE              =>      ENABLE,
            SEL_A               =>      SEL_A,
            SEL_B               =>      SEL_B,
            START_END           =>      START_END);
-------------------------------------------------------------------------
-- PROTOCOL SHIFT REGISTER
S_4: if SPEED = 4 generate
    I_START_END_REGISTER : REGISTERS
        generic map (
            REG_DIM => 1)
        port map (
            CLK         =>      CLK,
            RSTN        =>      RSTN,
            SEL         =>      OUTPUT_ENABLE,
            INPUT       =>      START_REG_ALFA(0 down to 0),
            OUTPUT      =>      START_END_SIG_ARRAY);
end generate S_4;
START_END_SIG <= START_END_SIG_ARRAY(0) when SPEED = 4 else START_REG_ALFA(0);
S_REG_PROTOCOL: for i in 0 to 4 generate
    I_START_REGISTER : REGISTERS
        generic map (
            REG_DIM => 1)
        port map (
            CLK         =>      CLK,
            RSTN        =>      RSTN,
            SEL         =>      OUTPUT_ENABLE,
            INPUT       =>      START_OUT_REGISTERS(i+1 downto i+1),
            OUTPUT      =>      START_OUT_REGISTERS(i downto i));
    I_END_REGISTER ; REGISTERS
        generic map (
            REG_DIM => 1)
        port map (
            CLK         =>      CLK,
            RSTN        =>      RSTN,
            SEL         =>      OUTPUT_ENABLE,
            INPUT       =>      END_OUT_REGISTERS(i+1 downto i+1),
            OUTPUT      =>      END_OUT_REGISTERS(i downto i));
end generate S_REG_PROTOCOL;
START_OUT_REGISTERS(5)      <= not(START_END) and START_END_SIG;
END_OUT_REGISTERS(5)        <= START_END and START_END_SIG;
START_FRAME_O       <= START_OUT_REGISTERS(0);
END_FRAME_O         <= END_OUT_REGISTERS(0);
SEL <= START_OUT_REGISTERS(0) or END_OUT_REGISTERS(0);
I_END1_REGISTER : REGISTERS
    generic map (
        REG_DIM => 1)
    port map (
        CLK         =>      CLK,
        RSTN        =>      RSTN,
        SEL         =>      SEL,
        INPUT       =>      START_OUT_REGISTERS(0 downto 0),
        OUTPUT      =>      DVALID_INT_ARRAY);
DVALID_INT <= DVALID_INT_ARRAY(0);
DVALID_O <= (DVALID_INT or START_OUT_REGISTERS(0) or END_OUT_REGISTERS(0)) and ENABLE_INT;
end STRS;
STEP module (entities and structural descriptions)
entity STEP is
    generic (
        SPEED               :   integer :=4;              -- Speed configuration
        MAX_log_MAP         :   integer := 0;             -- 0 -> no log correction, 1 -> log correction
        S_METRIC            :   integer := 5;             -- Branch prob. metric
        S_METRIC_MAX        :   integer := 13;
        S_METRIC_IN         :   integer := 12;            -- State metric for inputs
        S METRIC_OUT        :   integer := 13;                  -- State metric for outputs (S_METRIC_IN exor
S_METRIC_IN+1)
        N_STATES            :   integer := 8              -- Number of states
    );
    port (
```

```
        CLK                 :   in std_ulogic;                 -- Clock
        RSTN                :   in std_ulogic;                 -- Reset, active low
        SYNCH_IN            :   in std_ulogic;                 -- Input sync.
        ENABLE              :   in std_ulogic;
        GEN_CTRL            :   in std_ulogic_vector(1 downto 0);    -- 00 -> gen 1,
                                                                     -- 01 -> gen 2,
                                                                     -- 10 -> gen 3,
                                                                     -- 11 -> gen 4;
        EXP                 :   in std_ulogic_vector(1 downto 0);
        BRANCH_ALFA_0       :   in std_ulogic_vector(B_METRIC-1 downto 0);
        BRANCH_ALFA_1       :   in std_ulogic_vector(B_METRIC-1 downto 0);
        BRANCH_ALFA_2       :   in std_ulogic_vector(B_METRIC-1 downto 0);
        BRANCH_ALFA_3       :   in std_ulogic_vector(B_METRIC-1 downto 0);
        BRANCH_BETA_0       :   in std_ulogic_vector(B_METRIC-1 downto 0);
        BRANCH_BETA_1       :   in std_ulogic_vector(B_METRIC-1 downto 0);
        BRANCH_BETA_2       :   in std_ulogic_vector(B_METRIC-1 downto 0);
        BRANCH_BETA_3       :   in std_ulogic_vector(B_METRIC-1 downto 0);
        ALFA_IN             :   in std_ulogic_vector(N_STATES*S_METRIC_MAX-1 downto 0);   BETA_IN
    :       in std_ulogic_vector(N_STATES*S_METRIC_MAX-1 downto 0);    ALFA_OUT            out
std_ulogic_vector(N_STATES*S_METRIC_MAX-1 downto 0);                   BETA_OUT            out
std_ulogic_vector(N_STATES*S_METRIC_MAX-1 downto 0) );
    begin
end STEP ;
architecture STRS of STEP is
    type bus_type is array (0 to N_STATES-1) of std_ulogic_vector)S_METRIC_IN-1 downto 0);
    type out_bus_type is array (0 to N_STATES-1) of std_ulogic_vector)S_METRIC_IN downto 0);
    type metric_type is array (0 to N_STATES/2-1) of std_ulogic_vector)B_METRIC-1 downto 0);
    type bus_type_2speed is array (0 to N_STATES/2-1) of std_ulogic_vector)S_METRIC_IN-1 downto
0);
    type out_bus_type_2speed is array (0 to N_STATES/2-1) of std_ulogic_vector)S_METRIC_IN
downto 0);
    type metric_type_2speed is array (0 to N_STATES/4-1) of std_ulogic_vector)B_METRIC-1 downto
0);
    type bus_type_1speed is array (0 to N_STATES/4-1) of std_ulogic_vector)S_METRIC_IN-1 downto
0);
    type out_bus_type_1speed is array (0 to N_STATES/4-1) of std_ulogic_vector)S_METRIC_IN
downto 0);
    type metric_type_1speed is array (0 to N_STATES/8-1) of std_ulogic_vector)B_METRIC-1 downto
0);
    signal ALFA_INPUT : bus_type;
    signal BETA_INPUT : bus_type;
    signal ALFA_OUTPUT : out_bus_type;
    signal BETA_OUTPUT : out_bus_type;
    signal BUTTERFLY_INPUT : bus_type;
    signal BUTTERFLY_OUTPUT : out_bus_type;
    signal ALFA_MERGE : std_ulogic_vector(N_STATES*S_METRIC_OUT-1 downto 0);
    signal BETA_MERGE : std_ulogic_vector(N_STATES*S_METRIC_OUT-1 downto 0);
    signal ALFA_OUTPUT_REG : std_ulogic_vector(N_STATES*S_METRIC_OUT-1 downto 0);
    signal BETA_OUTPUT_REG : std_ulogic_vector(N_STATES*S_METRIC_OUT-1 downto 0);
    signal A_0_METRICS : metric_type;
    signal A_1_METRICS : metric_type;
    signal B_0_METRICS : metric_type;
    signal B_1_METRICS : metric_type;
    signal BUTTERFLY_0_METRICS : metric_type;
    signal BUTTERFLY_1_METRICS : metric_type;
    signal BUTTERFLY_0_METRICS_2SPEED : metric_type_2speed;
    signal BUTTERFLY_1_METRIC_2SPEED : metric_type_2speed;
    signal BUTTERPLY_INPUT_2SPEED : bus_type_2speed;
    signal BUTTERFLY_OUTPUT_2SPEED : out_bus_type_2speed;
    signal BUTTERFLY_0_METRICS_1SPEED : metric_type_1speed;
    signal BUTTERFLY_1_METRICS_1SPEED : metric_type_1speed;
    signal BUTTERFLY_INPUT_1SPEED : bus_type_1speed;
    signal BUTTERFLY_OUTPUT_1SPEED : out_bus_type_1speed;
    signal CTRL_ALFA : std_ulogic_vector(N_STATES/2-1 downto 0);
    signal CTRL_BETA : std_ulogic_vector(N_STATES/2-1 downto 0);
    signal CTRL_A : std_ulogic_vector(N_STATES/2-1 downto 0);
    signal CTRL_B : std_ulogic_vector(N_STATES/2-1 downto 0);
    signal ALFA_BETA : std_ulogic;            -- 0 -> ALFA, 1 -> BETA
    signal UP_DN_2SPEED : std_ulogic;         -- 0 -> UP, 1 -> DN
    signal UP_DN_1SPEED : std_ulogic;         -- 0 -> UP, 1 -> DN
begin
    INPUT_SPLIT: for i in 0 to N_STATES-1 generate
        ALFA_INPUT(i) <= ALFA_IN (i*S_METRIC_MAX+S_METRIC_IN-1 downto i*S_METRIC_MAX);
        BETA_INPUT(i) <= BETA_IN(i*S_METRIC_MAX+S_METRIC_IN-1 downto i*S_METRIC_MAX);
    end generate INPUT_SPLIT;
    SPEED_4: if SPEED = 4 generate
        -- Architecture with N_STATES butterfly unit
        -- No Control needs
            CTRL_A <= (others => '1');
```

```
                CTRL_B <= (others => '1');
            INSTANTIATING_BUTTERFLY: for i in 0 to N_STATES/2-1 generate
                I_SPLIT_METRICS : SPLIT_METRICS
                    generic map (
                        BUTTERFLY      => i
                        B_METRIC       => B_METRIC,
                        N_STATES       => N_STATES
                        )
                    port map (
                        GEN_CTRL => GEN_CTRL,
                        BRANCH_ALFA_0       =>       BRANCH_ALFA_0,
                        BRANCH_ALFA_1       =>       BRANCH_ALFA_1,
                        BRANCH_ALFA_2       =>       BRANCH_ALFA_2,
                        BRANCH_ALFA_3       =>       BRANCH_ALFA_3,
                        BRANCH_BETA_0       =>       BRANCH_BETA_0,
                        BRANCH_BETA_1       =>       BRANCH_BETA_1,
                        BRANCH_BETA_2       =>       BRANCH_BETA_2,
                        BRANCH_BETA_3       =>       BRANCH_BETA_3,
                        ALFA_METRIC_0       =>       A_0_METRICS(i),
                        ALFA_METRIC_1       =>       A_1_METRICS(i),
                        BETA_METRIC_0       =>       B_0_METRICS(i),
                        BETA_METRIC_1       =>       B_1_METRICS(i)
                        );
                I_BUTTERFLY_ALFA : BUTTERFLY
                    generic map (
                        MAX_log_MAP    =>    MAX_log_MAP,
                        B_METRIC       =>    B_METRIC,
                        S_METRIC       =>    S_METRIC_IN)
                    port map (
                        CLK => CLK,
                        RSTN => RSTN,
                        ENABLE => ENABLE,
                        EXP => EXP,
                        PRB_A => A_0_METRICS(i),
                        PRB_B => A_1_METRICS(i),
                        IN_UP => ALFA_INPUT(2*i),
                        IN_DN => ALFA_INPUT(2*i+1),
                        OUT_UP => ALFA_OUTPUT(i),
                        OUT_DN => ALFA_OUTPUT(i+N_STATES/2)
                        );
                I_BUTTERFLY_BETA : BUTTERFLY
                    generic map (
                        MAX_log_MAP      => MAX_log_MAP,
                        B_METRIC         => B_METRIC,
                        S_METRIC         => S_METRIC_IN)
                    port map (
                        CLK => CLK,
                        RSTN => RSTN,
                        ENABLE => ENABLE,
                        EXP => EXP,
                        PRB_A => B_0_METRICS(i),
                        PRB_B => B_1_METRICS(i),
                        IN_UP => BETA_INPUT(i),
                        IN_DN => BETA_INPUT(i+N_STATES/2),
                        OUT_UP => BETA_OUTPUT(2*i),
                        OUT_DN => BETA_OUTPUT(2*i+1)
                        );
            end generate INSTANTIATING_BUTTERFLY;
        end generate SPEED_4;
        SPEED_3: if SPEED = 3 generate
            -- Architecture with N_STATES/2 butterfly unit
            -- Input mux
            BUTTERFLY_0_METRICS <= A_0_METRICS when ALFA_BETA = '0' else B_0_METRICS;
            BUTTERFLY_1_METRICS <= A_1_METRICS when ALFA_BETA = '0' else B_1_METRICS;
            I_O: for i in 0 to N_STATES/2-1 generate
                BUTTERFLY_INPUT(i) <= ALFA_INPUT(2*i) when ALFA_BETA = '0' else BETA_INPUT(i);
                BUTTERFLY_INPUT(i+N_STATES/2) <= ALFA_INPUT(2*i+1) when ALFA_BETA = '0' else
BETA_INPUT(i+N_STATES/2);
                -- Output registration
                ALFA_OUTPUT(i) <= BUTTERFLY_OUTPUT(i);
                ALFA_OUTPUT(i)+N_STATES/2) <= BUTTERFLY_OUTPUT(i+N_STATES/2);
                BETA_OUTPUT(2*i) <= BUTTERFLY_OUTPUT(i);
                BETA_OUTPUT(2*1+1) <= BUTTERFLY_OUTPUT(i+N_STATES/2);
            end generate I_O;
            I_CONTROL_3SPEED : CONTROL_3SPEED
                generic map (
                    N_STATES => N_STATES)
                port map (
                    CLK                =>        CLK,
```

```
                    RSTN            =>      RSTN,
                    SYNCH_IN        =>      SYNCH_IN,
                    ENABLE          =>      ENABLE,
                    ALFA_BETA       =>      ALFA_BETA,
                    CTRL_ALFA       =>      CTRL_A,
                    CTRL_BETA       =>      CTRL_B);
        INSTANTIATING_BUTTERFLY: for i in 0 to N_STATES/2-1 generate
            I_SPLIT_METRICS : SPLIT_METRICS
                generic map (
                    BUTTERFLY       =>      i;
                    B_METRIC        =>      B_METRIC,
                    N_STATES        =>      N_STATES
                    )
                port map (
                    GEN_CTRL => GEN_CTRL,
                    BRANCH_ALFA_0       =>      BRANCH_ALFA_0,
                    BRANCH_ALFA_1       =>      BRANCH_ALFA_1,
                    BRANCH_ALFA_2       =>      BRANCH_ALFA_2,
                    BRANCH_ALFA_3       =>      BRANCH_ALFA_3,
                    BRANCH_BETA_0       =>      BRANCH_BETA_0,
                    BRANCH_BETA_1       =>      BRANCH_BETA_1,
                    BRANCH_BETA_2       =>      BRANCH_BETA_2,
                    BRANCH_BETA_3       =>      BRANCH_BETA_3,
                    ALFA_METRIC_0       =>      A_0_METRICS(i),
                    ALFA_METRIC_1       =>      A_1_METRICS(i),
                    BETA_METRIC_0       =>      B_0_METRICS(i),
                    BETA_METRIC_1       =>      B_1_METRICS(i)
                    );
            I_BUTTERFLY : BUTTERFLY
                generic map (
                    MAX_log_MAP     =>      MAX_log_MAP,
                    B_METRIC        =>      B_METRIC,
                    S_METRIC        =>      S_METRIC_IN)
                port map (
                    CLK => CLK,
                    RSTN => RSTN,
                    EXP => EXP,
                    ENABLE => ENABLE,
                    PRB_A => BUTTERFLY_0_METRICS(i),
                    PRB_B => BUTTERFLY_1_METRICS(i),
                    IN_UP => BUTTERFLY_INPUT(i),
                    IN_DN => BUTTERFLY_INPUT(i+N_STATES/2),
                    OUT_UP => BUTTERFLY_OUTPUT(i),
                    OUT_DN => BUTTERFLY_OUTPUT(i+N_STATES/2)
                    );
        end generate INSTANTIATING_BUTTERFLY;
    end generate SPEED_3;
    SPEED_2: if SPEED = 2 generate
        -- Architecture with N_STATES/4 butterfly unit
        -- Alfa/Beta input mux
        BUTTERFLY_0_METRICS <= A_0_METRICS when ALFA_BETA = '0' else B_0_METRICS;
        BUTTERFLY_1_METRICS <= A_1_METRICS when ALFA_BETA = '0' else B_1_METRICS;
        I_O: for i in 0 to N_STATES/2-1 generate
            BUTTERFLY_INPUT(i) <= ALFA_INPUT(2*i) when ALFA_BETA = '0' else BETA_INPUT(i);
            BUTTERFLY_INPUT(i+N_STATES/2) <= ALFA_INPUT(2*i+1) when ALFA_BETA = '0' else
BETA_INPUT(i+N_STATES/2);
            -- Output registration
            ALFA_OUTPUT(i) <= BUTTERFLY_OUTPUT(i);
            ALFA_OUTPUT(i+N_STATES/2) <= BUTTERFY_OUTPUT(i+N_STATES/2);
            BETA_OUTPUT(2*i) <= BUTTERFLY_OUTPUT(i);
            BETA_OUTPUT(2*i+1) <= BUTTERFLY_OUTPUT(i+N_STATES/2);
        end generate I_O;
        -- Up/Dn input mux
        UP_DN: for i in 0 to N_STATES/4-1 generate
            BUTTERFLY_0_METRICS_2SPEED(i) <= BUTTERFLY_0_METRICS(i) when UP_DN_2SPEED='1' else
BUTTERFLY_0_METRICS(i+N_STATES/4);
            BUTTERFLY_1_METRICS_2SPEED(i) <= BUTTERFLY_1_METRICS(i) when UP_DN_2SPEED='1' else
BUTTERFLY_1_METRICS(i+N_STATES/4);
            BUTTERFLY_INPUT_2SPEED(2*i) <= BUTTERFLY_INPUT(i) when UP_DN_2SPEED='1' else
BUTTERFLY_INPUT(i+N_STATES/4);
            BUTTERFLY_INPUT_2SPEED(2*i+1) <= BUTTERFLY_INPUT(i+N_STATES/2) when UP_DN_2SPEED='1'
else BUTTERFLY_INPUT(i+N_STATES/4+N_STATES/2);
            -- Ouput Registration
            BUTTERFLY_OUTPUT(i) <= BUTTERFLY_OUTPUT_2SPEED(2*i);
            BUTTERFLY_OUTPUT(i+N_STATES/2) <= BUTTERFLY_OUTPUT_2SPEED(2*i+1);
            BUTTERFLY_OUTPUT(i+N_STATES/4) <= BUTTERFLY_OUTPUT_2SPEED)2*i);
            BUTTERFLY_OUTPUT(i+N_STATES/2+N_STATES/4) <= BUTTERFLY_OUTPUT_2SPEED(2*i+1);
        end generate UP_DN;
        I_CONTROL_2SPEED : CONTROL_2SPEED
```

-continued

```
            generic map (
                N_STATES => N_STATES)
            port map (
                CLK                 =>      CLK,
                RSTN                =>      RSTN,
                SYNCH_IN            =>      SYNCH_IN,
                ENABLE              =>      ENABLE,
                ALFA_BETA           =>      ALFA_BETA,
                UP_DN_2SPEED        =>      UP_DN_2SPEED,
                CTRL_ALFA           =>      CTRL_A,
                CTRL_BETA           =>      CTRL_B);
        INSTANTIATING_SPLIT_METRICS: for i in 0 to N_STATES/2-1 generate
            I_SPLIT_METRICS : SPLIT_METRICS
                generic map (
                    BUTTERFLY       =>      i,
                    B_METRIC        =>      B_METRIC,
                    N_STATES        =>      N_STATES
                    )
                port map (
                    GEN_CTRL => GEN_CTRL,
                    BRANCH_ALFA_0       =>      BRANCH_ALFA_0,
                    BRANCH_ALFA_1       =>      BRANCH_ALFA_1,
                    BNANCH_ALFA_2       =>      BRANCH_ALFA_2,
                    BRANCH_ALFA_3       =>      BRANCH_ALFA_3,
                    BRANCH_BETA_0       =>      BRANCH_BETA_0,
                    BRANCH_BETA_1       =>      BRANCH_BETA_1,
                    BRANCH_BETA_2       =>      BRANCH_BETA_2,
                    BRANCH_BETA_3       =>      BRANCH_BETA_3,
                    ALFA_METRIC_0       =>      A_0_METRICS(i),
                    ALFA_METRIC_1       =>      A_1_METRICS(i),
                    BETA_METRIC_2       =>      B_0_METRICS(i),
                    BETA_METRIC_3       =>      B_1_METRICS(i)
                    );
        end generate INSTANTIATING_SPLIT_METRICS;
        INSTANTIATING_BUTTERFLY: for i in 0 to N_STATES/4-1 generate
            I_BUTTERFLY : BUTTERFLY
                generic map (
                    MAX_log_MAP     =>      MAX_log_MAP,
                    B_METRIC        =>      B_METRIC,
                    S_METRIC        =>      S_METRIC_IN)
                port map (
                    CLK => CLK,
                    RSTN => RSTN,
                    ENABLE => ENABLE,
                    EXP => EXP,
                    PRB_A => BUTTERFLY_0_METRICS_2SPEED(i),
                    PRB_B => BUTTERFLY_1_METRICS_2SPEED(i),
                    IN_UP => BUTTERFLY_INPUT_2SPEED(2*i),
                    IN_DN => BUTTERFLY_INPUT_2SPEED(2*i+1),
                    OUT_UP => BUTTERFLY_OUTPUT_2SPEED(2*i),
                    OUT_DN => BUTTERFLY_OUTPUT_2SPEED(2*i+1)
                    );
        end generate INSTANTIATING_BUTTERFLY;
    end generate SPEED_2;
    SPEED_1: if SPEED = 1 generate
        -- Architecture with N_STATES/8 butterfly unit
        -- Alfa/Beta input mux
        BUTTERFLY_0_METRICS <= A_0_METRICS when ALFA_BETA = '0' else B_0_METRICS;
        BUTTERFLY_1_METRICS <= A_1_METRICS when ALFA_BETA = '0' else B_1_METRICS;
    I_O: for i in 0 to N_STATES/2-1 generate
        BUTTERFLY_INPUT(i) <= ALFA_INPUT(2*i) when ALFA_BETA = '0' else BETA_INPUT(i);
        BUTTERFLY_INPUT(i+N_STATES/2) <= ALFA_INPUT(2*i+1) when ALFA_BETA = '0' else
BETA_INPUT(i+N_STATES/2);
        -- Output registration
        ALFA_OUTPUT(i) <= BUTTERFLY_OUTPUT(i);
        ALFA_OUTPUT(i+N_STATES/2) <= BUTTERFLY_OUTPUT(i+N_STATES/2)
        BETA_OUTPUT(2*i) <= BUTTERFLY_OUTPUT(i);
        BETA_OUTPUT(2*i+1) <= BUTTERFLY_OUTPUT(i+N_STATES/2);
    end generate I_O;
    -- Up/Dn 2 speed input mux
    UP_DN: for i in 0 to N_STATES/4-1 generate
        BUTTERFLY_0_METRICS_2SPEED(i) <= BUTTERFLY_0_METRICS(i) when UP_DN_2SPEED='1' else
BUTTERFLY_0_METRICS(i+N_STATES/4);
        BUTTERFLY_1_METRICS_2SPEED(i) <= BUTTERFLY_1_METRICS(i) when UP_DN_2SPEED='1' else
BUTTERFLY_1_METRICS(i+N_STATES/4);
        BUTTERFLY_INPUT_2SPEED(2*i) <= BUTTERFLY_INPUT(i) when UP_DN_2SPEED='1' else
BUTTERFLY_INPUT(i+N_STATES/4);
        BUTTERFLY_INPUT_2SPEED(2*i+1) <= BUTTERFLY_INPUT(i+N_STATES/2) when UP_DN_2SPEED='1'
else BUTTERFLY_INPUT(i+N_STATES/4+N_STATES/2);
```

```
-- Output Registration
    BUTTERFLY_OUTPUT(i) <= BUTTERFLY_OUTPUT_2SPEED(2*i);
    BUTTERFLY_OUTPUT(i+N_STATES/2) <= BUTTERFLY_OUTPUT_2SPEED(2*i+1);
    BUTTERFLY_OUTPUT(i+N_STATES/4) <= BUTTERFLY_OUTPUT_SPEED)(2*i);
    BUTTERFLY_OUTPUT(i+N_STATES/2+N_STATES/4) <= BUTTERFLY_OUTPUT_2SPEED(2*i+1);
  end generate UP_DN;
  -- Up/Dn 1 speed input mux
  UP_DN_1S: for i in 0 to N_STATES/8-1 generate
    BUTTERFLY_0_METRICS_1SPEED(i) <= BUTTERFLY_0_METRICS_2SPEED(i) when UP_DN_1SPEED='1'
  else BUTTERFLY_0_METRICS_2SPEED(i+N_STATES/8);
    BUTTERFLY_1_METRICS_SPEED(i) <= BUTTERFLY_1_METRICS_2SPEED(i) when UP_DN_1SPEED='1'
  else BUTTERFLY_1_METRICS_2SPEED(i+N_STATES/8);
    BUTTERFLY_INPUT_1SPEED(2*i) <= BUTTERFLY_INPUT_2SPEED(2*i) when UP_DN_1SPEED='1' else
  BUTTERFLY_INPUT_2SPEED(2*i+N_STATES/4);
    BUTTERFLY_INPUT_1SPEED(2*i+1) <= BUTTERFLY_INPUT_2SPEED(2*i+1) when UP_DN_1SPEED='1'
  else BUTTERFLY_INPUT_2SPEED(2*i+1+N_STATES/4);
  -- Ouput Registration
    BUTTERFLY_OUTPUT_2SPEED(2*i) <= BUTTERFLY_OUTPUT_1SPEED(2*i);
    BUTTERFLY_OUTPUT_2SPEED(2*i+1) <= BUTTERFLY_OUTPUT_1SPEED(2*i+1);
    BUTTERFLY_OUTPUT_2SPEED(2*i+N_STATES/4) <= BUTTERFLY_OUTPUT_1SPEED (2*i);
    BUTTERFLY_OUTPUT_2SPEED(2*i+1+N_STATES/4) <= BUTTERFLY_OUTPUT_SPEED(2*i+1);
  end generate UP_DN_1S;
  I_CONTROL_1SPEED : CONTROL_1SPEED
    generic map (
      N_STATES => N_STATES)
    port map (
      CLK              =>    CLK,
      RSTN             =>    RSTN,
      SYNCH_IN         =>    SYNCH_IN,
      ENABLE           =>    ENABLE,
      ALFA_BETA        =>    ALFA_BETA,
      UP_DN_2SPEED     =>    UP_DN_2SPEED,
      UP_DN_1SPEED     =>    UP_DN_1SPEED,
      CTRL_ALFA        =>    CTRL_A,
      CTRL_BETA        =>    CTRL_B);
  INSTANTIATING_SPLIT_METRICS: for i in 0 to N_STATES/2-1 generate
    I_SPLIT_METRICS : SPLIT_METRICS
      generic map (
        BUTTERFLY    =>    i,
        B_METRIC     =>    B_METRIC,
        N_STATES     =>    N_STATES
        )
      port map (
        GEN_CTRL => GEN_CTRL,
        BRANCH_ALFA_0    =>    BRANCH_ALFA_0,
        BRANCH_ALFA_1    =>    BBANCH_ALFA_1,
        BRANCH_ALFA_2    =>    BRANCH_ALFA_2,
        BRANCH_ALFA_3    =>    BRANCH_ALFA_3,
        BRANCH_BETA_0    =>    BRANCH_BETA_0,
        BRANCH_BETA_1    =>    BRANCH_BETA_1,
        BRANCH_BETA_2    =>    BRANCH_BETA_2,
        BRANCH_BETA_3    =>    BRANCH_BETA_3,
        ALFA_METRIC_0    =>    A_0_METRICS(i),
        ALFA_METRIC_1    =>    A_1_METRICS(i),
        BETA_METRIC_0    =>    B_0_METRICS(i),
        BETA_METRIC_1    =>    B_1_METRICS(i)
        );
  end generate INSTANTIATING_SPLIT_METRICS;
  INSTANTIATING_BUTTERFLY: for i in 0 to N_STATES/8-1 generate
    I_BUTTERFLY : BUTTERFLY
      generic map (
        MAX_log_MAP  =>    MAP_log_MAP,
        B_METRIC     =>    B_METRIC,
        S_METRIC     =>    S_METRIC_IN)
      port map (
        CLK => CLK,
        RSTN => RSTN,
        ENABLE => ENABLE,
        EXP => EXP,
        PRB_A => BUTTERFLY_0_METRICS_1SPEED(i),
        PRB_B => BUTTERFLY_1_METRICS_1SPEED(i),
        IN_UP => BUTTERFLY_INPUT_1SPEED(2*i),
        IN_DN => BUTTERFLY_INPUT_1SPEED(2*i+1),
        OUT_UP => BUTTERFLY_OUTPUT_1SPEED(2*i),
        OUT_DN => BUTTERFLY_OUTPUT_1SPEED(2*i+1)
        );
  end generate INSTANTIATING_BUTTERFLY;
end generate SPEED_1;
  MERGE: for i in 0 to N_STATES-1 generate
```

```vhdl
        ALFA_MERGE((i+1)*S_METRIC_OUT-1 downto i*S_METRIC_OUT) <= ALFA_OUTPUT(i) (S_METRIC_OUT-1 downto 0);
        BETA_MERGE((i+1)*S_METRIC_OUT-1 downto i*S_METRIC_OUT) <= BETA_OUTPUT(i) (S_METRIC_OUT-1 downto 0);
    end generate MERGE;
    CTRL: for i in 0 to N_STATES/2-1 generate
        CTRL_ALFA(i) <= CTRL_A(i) and ENABLE;
        CTRL_BETA(i) <= CTRL_B(i) and ENABLE;
    end generate CTRL;
    I_ALFA_REG : ALFA_REG
        generic map (
            REG_DIM       =>    S_METRIC_OUT,
            N_STATES      =>    N_STATES)
        port map (
            CLK           =>    CLK,
            RSTN          =>    RSTN,
            CTRL          =>    CTRL_ALFA,
            INPUT         =>    ALFA_MERGE,
            OUTPUT        =>    ALFA_OUTPUT_REG
        );
    I_BETA_REG : BETA_REG
        generic map (
            REG_DIM       =>    S_METRIC_OUT,
            N_STATES      =>    N_STATES)
        port map (
            CLK           =>    CLK,
            RSTN          =>    RSTN,
            CTRL          =>    CTRL_BETA,
            INPUT         =>    BETA_MERGE,
            OUTPUT        =>    BETA_OUTPUT_REG
        );
    OUTPUT_ORGANIZZATION: for i in 0 to N_STATES-1 generate
        ALFA_OUT(i*S_METRIC_MAX+S_METRIC_OUT-1 downto i*S_METRIC_MAX) <= ALFA_OUTPUT_REG((i+1) *S_METRIC_OUT-1 downto i*S_METRIC_OUT);
        BETA_OUT(i*S_METRIC_MAX+S_METRIC_OUT-1 downto i*S_METRIC_MAX) <= BETA_OUTPUT_REG((i+1) *S_METRIC_OUT_1 downto i*S_METRIC_OUT);
    end generate OUTPUT_ORGANIZZATION;
end STRS;
```

BUTTERFLY MODULE VHDL CODE

Butterfly module VHDL code (entities and structural descriptions)

```vhdl
entity BUTTERFLY is
    generic (
        MAX_log_MAP       : integer := 0;      -- 0 -> no log correction, 1 -> log correction
        B_METRIC          : integer := 5;      -- Branch prob. metric
        S_METRIC          : integer := 12      -- State metric
    );
    port (
        CLK               : in std_ulogic;                              -- Clock
        RSTN              : in std_ulogic;                              -- Reset, active low
        ENABLE            : in std_ulogic;
        EXP               : in std_ulogic_vector(1 downto 0);           -- Exponent state for log. correction
        PRB_A             : in std_ulogic_vector(B_METRIC-1 downto 0);
        PRB_B             : in std_ulogic_vector(B_METRIC-1 downto 0);
        IN_UP             : in std_ulogic_vector(S_METRIC-1 downto 0);  -- Up input of butterfly
        IN_DN             : in std_ulogic_vector(S_METRIC-1 downto 0);  -- Dn input of butterfly
        OUT_UP            : out std_ulogic_vector(S_METRIC downto 0);   -- Up output of butterfly
        OUT_DN            : out std_ulogic_vector(S_METRIC downto 0)    -- Dn output of butterfly
    );
begin
end BUTTERFLY;
architecture STRS of BUTTERFLY is
    signal DIFF_UP          : std_ulogic_vector(S_METRIC+1 downto 0);
    signal DIFF_DN          : std_ulogic_vector(S_METRIC+1 downto 0);
    signal OUT_ANTE_UP      : std_ulogic_vector(S_METRIC downto 0);
    signal OUT_ANTE_DN      : std_ulogic_vector(S_METRIC downto 0);
begin
    MAX_log_MAP_case : if MAX_log_MAP = 0 generate
        I_ACS_UP : ACS
            generic map (
                B_METRIC      =>    B_METRIC,
                S_METRIC      =>    S_METRIC)
            port map (
                CLK           =>    CLK,
                RSTN          =>    RSTN,
                ENABLE        =>    ENABLE,
                SIG_A         =>    IN_UP
```

```
                    SIG_B         =>      IN_DN,
                    PRB_A         =>      PRB_A,
                    PRB_B         =>      PRB_B,
                    OUTPUT        =>      OUT_UP,
                    DIFF          =>      open);
        I_ACS_DN : ACS
            generic map (
                    B_METRIC => B_METRIC,
                    S_METRIC => S_METRIC)
            port map (
                    CLK           =>      CLK,
                    RSTN          =>      RSTN,
                    ENABLE        =>      ENABLE,
                    SIG_A         =>      IN_UP,
                    SIG_B         =>      IN_DN,
                    PRB_A         =>      PRB_B,
                    PRB_B         =>      PRB_A,
                    OUTPUT        =>      OUT_DN,
                    DIFF          =>      open);
end generate MAX_log_MAP_case;
log_MAP_case : if MAX_log_MAP = 1 generate
        I_ACS_UP : ACS
            generic map (
                    B_METRIC      =>      B_METRIC,
                    S_METRIC      =>      S_METRIC)
            port map (
                    CLK           =>      CLK,
                    RSTN          =>      RSTN,
                    ENABLE        =>      ENABLE,
                    SIG_A         =>      IN_UP,
                    SIG_B         =>      IN_DN,
                    PRB_A         =>      PRB_A,
                    PRB_B         =>      PRB_B,
                    OUTPUT        =>      OUT_ANTE_UP,
                    DIFF          =>      DIFF_UP);
        I_ACS_DN : ACS
            generic map (
                    B_METRIC      =>      B_METRIC,
                    S_METRIC      =>      S_METRIC)
            port map (
                    CLK           =>      CLK,
                    RSTN          =>      RSTN,
                    ENABLE        =>      ENABLE,
                    SIG_A         =>      IN_UP,
                    SIG_B         =>      IN_DN,
                    PRB_A         =>      PRB_B,
                    PRB_B         =>      PRB_A,
                    OUTPUT        =>      OUT_ANTE_DN,
                    DIFF          =>      DIFF_DN);
        I_ERROR_UP : ERROR_C
            generic map (
                    S_METRIC => S_METRIC)
            port map (
                    CLK           =>      CLK,
                    RSTN          =>      RSTN,
                    INPUT         =>      OUT_ANTE_UP,
                    DIFF          =>      DIFF_UP,
                    EXP           =>      EXP,
                    OUTPUT        =>      OUT_UP);
        I_ERROR_DN : ERROR_C
            generic map (
                    S_METRIC      =>      S_METRIC)
            port map (
                    CLK           =>      CLK,
                    RSTN          =>      RSTN,
                    INPUT         =>      OUT_ANTE_DN,
                    DIFF          =>      DIFF_DN,
                    EXP           =>      EXP,
                    OUTPUT        =>      OUT_DN);
    end generate log_MAP_case;
end STRS;
```

Once the VHDL language source generation stage 300 has been completed, a fourth stage 400 is carried out in which the modules making up the IP encoding module 50 are specialized with particular groups of parameters (parameter scenarios), e.g., in order to implement a decoding circuit for a UMTS application.

In the fifth stage 500, zero delay logic simulation is carried out for each scenario defined earlier.

Logic simulation, for example, can be performed using commercially available programs such as SYNOPSYS VSS.

During stage 500, recycles can be performed to correct modules and/or parameters or constants should errors be found.

Once this stage has been successfully completed, the IP module 50 will generally have been simulated with zero delay for all possible parameter scenarios.

In the sixth stage 600, the first compilation is performed, e.g., with the SYNOPSYS Design Analyzer program, using a particular parameter scenario such as one designed to result in a particular convolutional encoding circuit.

Recycles can also be performed in stage 600. As will be readily apparent to a specialist in the field, such recycles may involve correcting modules and/or certain parameters or constants.

In the seventh stage 700, logical optimization is performed, e.g., by making further use of the SYNOPSYS Design Analyzer program, and a library of physical components is "latched" to the compiled modules in such a way as to obtain the actual synthesis compilation needed to produce the physical layout of an encoding circuit for use in a turbo decoder.

As will be readily apparent to a specialist in the field, the output of this stage 700 may be either the information needed for the physical implementation of a full-custom integrated circuit, which naturally can be obtained from the supplier of the physical libraries "latched" to the compiled module (stage 800) or, alternatively, the information needed for the physical programming of programmable components (stage 900) such as FPGAs (Field Programmable Gate Arrays).

Thus, with the flow chart as described, and using an encoding module 50 in accordance with the architecture described herein and specializing the modules with a particular parameter scenario, it is possible in accordance with the present invention to obtain a plurality of encoding circuits, each capable for example of decoding convolutional codes by means of a plurality of generator polynomials that can be activated selectively.

The dimensions, forms, materials, components, circuit elements and contacts as contemplated in the foregoing description are capable of modifications in various obvious respects, as are the details of the circuitry and construction as illustrated and of the operating method, all without departing from the scope of the invention as specified in the appended claims.

The invention claimed is:

1. A module for generating SISO circuits for decoding convolutional codes referred to as turbo codes for telecommunications, the module comprising:

storage means parametrically configured and representative of memory elements for storing probabilistic information associated with digital information;

computing means parametrically configured and representative of computing elements for decoding said probabilistic information on the basis of at least one pair of generator polynomials for reconstructing said digital information;

a plurality of pairs of different generator polynomials parametrically configurable and selectable through a control signal; and scenario means for configuring said storage means, said computing means and said plurality of pairs of different generator polynomials with parameter scenarios and for generating a single SISO circuit able to manage asymmetrical transmissions by selectively activating, during decoding, different generator polynomials by means of said control signal.

2. The module as defined in claim 1 wherein said scenario means comprise:

at least one length constraint parameter associated with said probabilistic information for establishing the size of said memory circuit elements.

3. The module as defined in claim 1 wherein said scenario means comprise:

at least one number of states parameter associated with said probabilistic information and configurable in order to establish the size of said memory circuit elements and of said computing circuit elements.

4. The module as defined in claim 1 wherein said scenario means comprise:

at least one resource sharing parameter for establishing a maximum number of computing elements to be used in shared fashion to decode convolutional codes.

5. The module as defined in claim 1 wherein said scenario means comprise:

at least one architecture parameter configurable for determining that said decoding circuit is associated with a specific type of architecture.

6. The module as defined in claim 1 further comprising:

at least one parameter representative of a control signal for said decoding circuit for selectively activating one of a plurality of pairs of generator polynomials for decoding said probabilistic information.

7. A method for implementing a SISO circuit for decoding convolutional codes in turbo devices for telecommunications, comprising the following steps:

A] developing and describing with a programming language interpreted by an electronic computer a parametric instruction module representative of memory elements capable of storing probabilistic information associated with digital information;

B] developing and describing with said language a parametric instruction module representative of computing elements that comprise a plurality of pairs of different generator polynomials parametrically configurable and selectable through a control signal, said computing elements decoding said probabilistic information on the basis of at least one pair of generator polynomials for reconstructing said digital information;

C] specializing the modules thus developed and described, assigning a specific parameter scenario to said modules;

D] compiling said specialized modules on silicon or on programmable logic units by means of said electronic computer in order to obtain, by means of said parameter scenario, a single SISO circuit having performance characteristics which will differ according to variations in said parameter scenarios; and wherein said plurality of pairs of different generator polynomials and control signal are configured for selectively activating, during decoding, different pairs of generator polynomials in order to manage asymmetrical transmissions.

8. The method as defined in claim 7 wherein step B comprises the further step of providing a parameter representative of a control signal for selectively activating one of said plurality of pairs of generator polynomials in said SISO circuit for decoding said probabilistic information.

9. A single SISO circuit for decoding convolutional codes comprising:

memory elements for storing probabilistic information associated with digital information;

computing elements for decoding said probabilistic information, said computing elements comprising a plurality of generator polynomials representing a plurality of decoding functions; and a control signal element for selectively activating in said computing elements, during decoding, different pairs of generator polynomials in order to manage asymmetrical transmissions.

* * * * *